(12) United States Patent
Kobayashi et al.

(10) Patent No.: US 10,665,668 B2
(45) Date of Patent: May 26, 2020

(54) SILICON CARBIDE SEMICONDUCTOR DEVICE AND METHOD OF MANUFACTURING A SILICON CARBIDE SEMICONDUCTOR DEVICE

(71) Applicant: FUJI ELECTRIC CO., LTD., Kawasaki-shi, Kanagawa (JP)

(72) Inventors: Yusuke Kobayashi, Tsukuba (JP); Naoyuki Ohse, Matsumoto (JP); Shinsuke Harada, Tsukuba (JP); Takahito Kojima, Matsumoto (JP)

(73) Assignee: FUJI ELECTRIC CO., LTD., Kawasaki-Shi, Kanagawa (JP)

(*) Notice: Subject to any disclaimer, the term of this patent is extended or adjusted under 35 U.S.C. 154(b) by 38 days.

(21) Appl. No.: 15/993,336

(22) Filed: May 30, 2018

(65) Prior Publication Data
US 2018/0358430 A1   Dec. 13, 2018

(30) Foreign Application Priority Data

Jun. 9, 2017   (JP) .................................. 2017-114765

(51) Int. Cl.
| | |
|---|---|
| H01L 29/06 | (2006.01) |
| H01L 29/16 | (2006.01) |
| H01L 29/78 | (2006.01) |
| H01L 29/66 | (2006.01) |
| H01L 29/10 | (2006.01) |
| H01L 21/04 | (2006.01) |
| H01L 29/08 | (2006.01) |

(52) U.S. Cl.
CPC .......... *H01L 29/063* (2013.01); *H01L 21/046* (2013.01); *H01L 29/0623* (2013.01); *H01L 29/0696* (2013.01); *H01L 29/0878* (2013.01); *H01L 29/1095* (2013.01); *H01L 29/1608* (2013.01); *H01L 29/66068* (2013.01); *H01L 29/7813* (2013.01); *H01L 29/66734* (2013.01)

(58) Field of Classification Search
None
See application file for complete search history.

(56) References Cited

U.S. PATENT DOCUMENTS

| | | | |
|---|---|---|---|
| 2010/0006861 A1* | 1/2010 | Yamamoto | ............ H01L 29/086 257/77 |
| 2011/0024831 A1 | 2/2011 | Nakano | |
| 2017/0221714 A1* | 8/2017 | Wakimoto | ........ H01L 29/66068 |

FOREIGN PATENT DOCUMENTS

JP       2009-260253 A    11/2009

* cited by examiner

*Primary Examiner* — Shaun M Campbell
*Assistant Examiner* — Aneta B Cieslewicz
(74) *Attorney, Agent, or Firm* — Rabin & Berdo, P.C.

(57) ABSTRACT

A vertical MOSFET having a trench gate structure includes an n⁻-type drift layer and a p-type base layer formed by epitaxial growth. In the n⁻-type drift layer, an n-type region, an upper second p⁺-type region, a lower second p⁺-type region and a first p⁺-type region are provided. The lower second p⁺-type region is provided orthogonal to a trench, and a total mathematical area regions that are between the first p⁺-type region and the p-type base layer and that include the n-type region is at least two times a total mathematical area of regions that are between the first p⁺-type region and the p-type base layer and that include the upper second p⁺-type region.

11 Claims, 29 Drawing Sheets

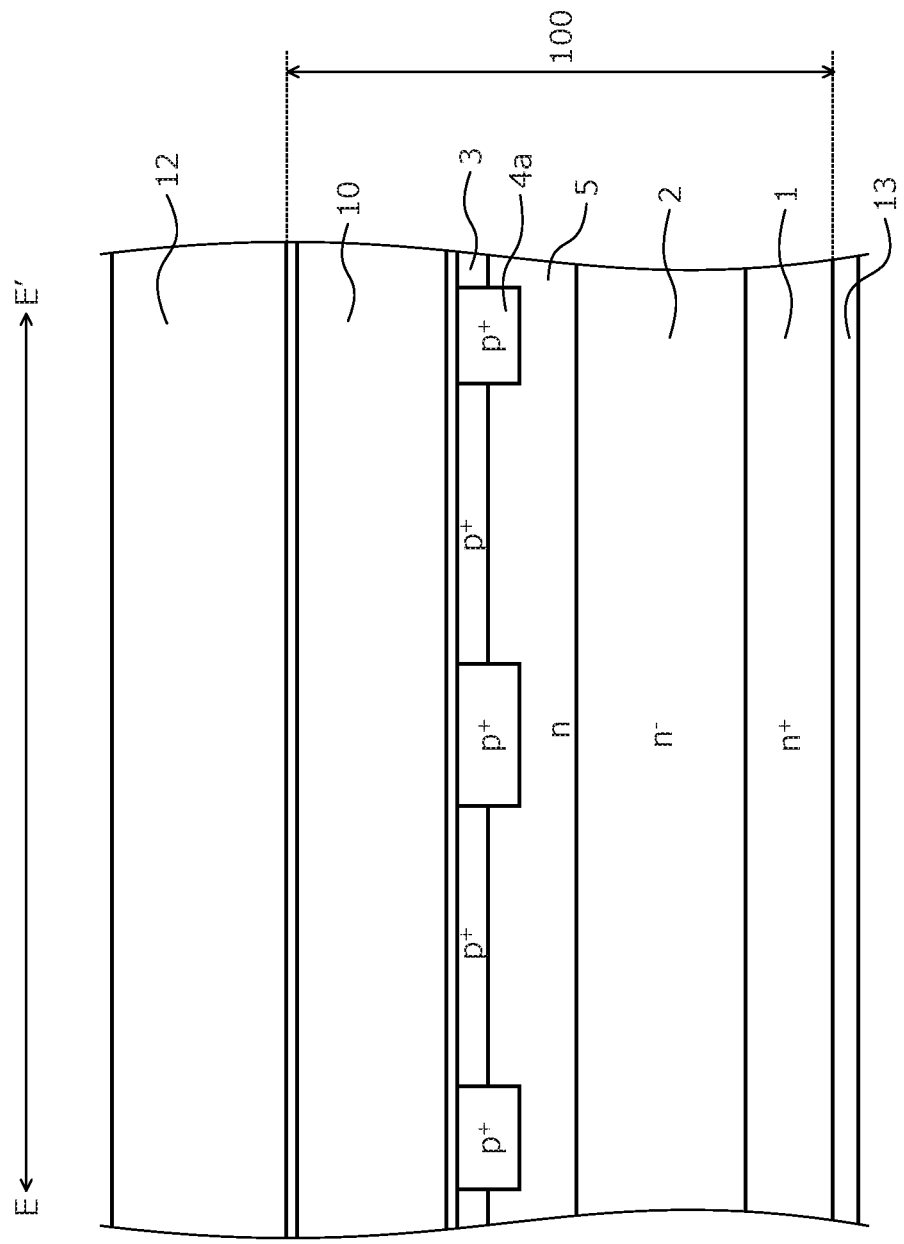

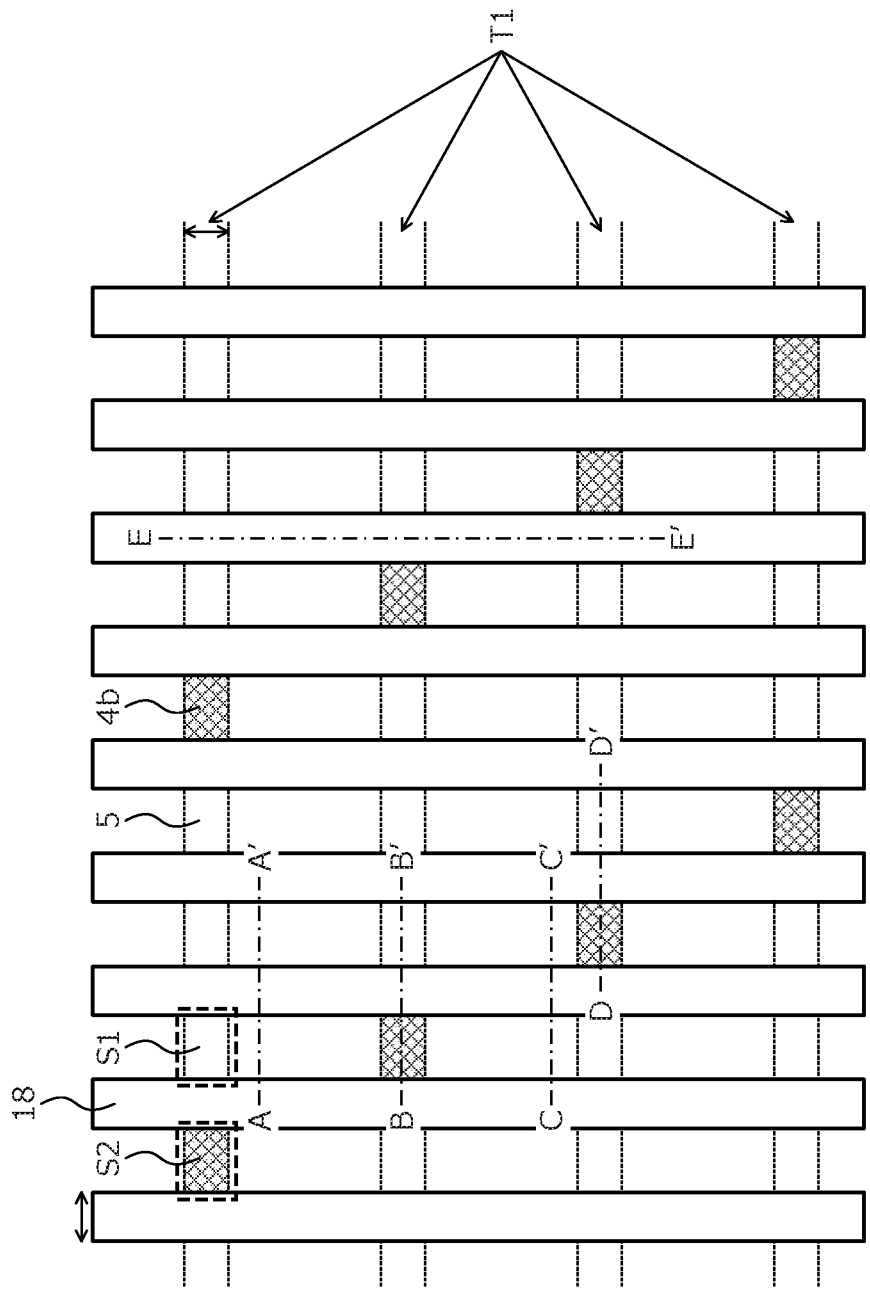

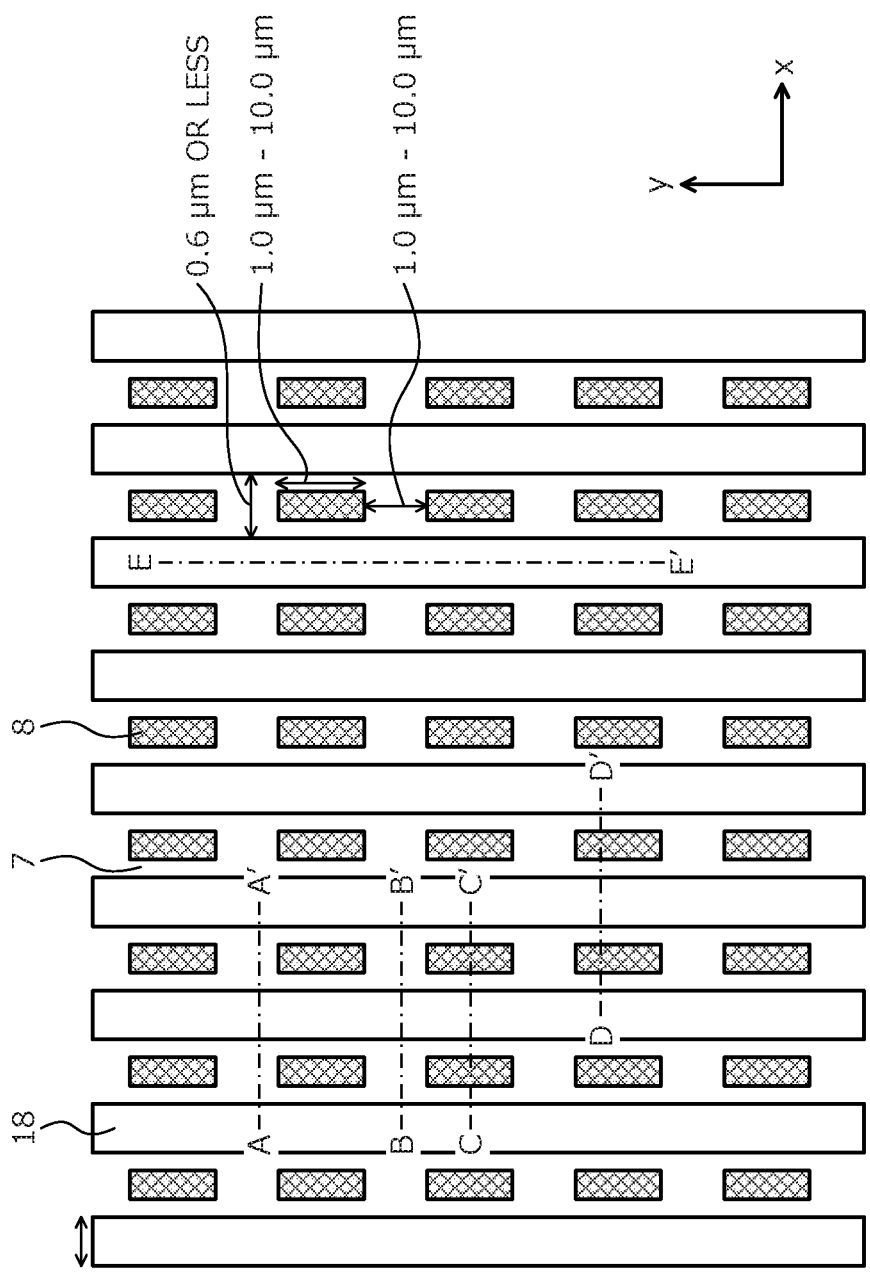

SILICON CARBIDE SEMICONDUCTOR DEVICE AND METHOD OF MANUFACTURING A SILICON CARBIDE SEMICONDUCTOR DEVICE

CROSS REFERENCE TO RELATED APPLICATIONS

This application is based upon and claims the benefit of priority of the prior Japanese Patent Application No. 2017-114765, filed on Jun. 9, 2017, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Conventionally, in a power semiconductor element, to facilitate reductions in element ON resistance, a vertical metal oxide semiconductor field effect transistor (MOSFET) having a trench structure is fabricated (manufactured). In the vertical MOSFET, a trench structure formed orthogonally to a surface of a substrate enables the cell density per unit area to be increased to a greater extent than does a planar structure in which a channel is formed parallel to the surface of the substrate and therefore, the former enables the current density per unit area to be increased and is advantageous from an aspect of cost.

Nonetheless, when a trench structure is formed in a vertical MOSFET, the structure is such that inner walls of the trench are covered entirely by a gate insulating film to form the channel in a vertical direction and a portion of the gate insulating film at a bottom of the trench is near a drain electrode, whereby high electric field tends to be applied to the portion of the gate insulating film at the bottom of the trench. In particular, with a wide bandgap semiconductor material (semiconductor material having a bandgap that is wider than that of silicon, e.g., silicon carbide (SiC)), an ultra-high voltage element is fabricated and therefore, adverse effects on the gate insulating film at the bottom of the trench significantly reduce reliability.

According to a technique proposed as a method to solve such problems, in a vertical MOSFET with a trench structure having a striped planar pattern, a $p^+$-type base region is provided between trenches, in a striped shape parallel to the trenches (for example, refer to Japanese Laid-Open Patent Publication No. 2009-260253). According to another proposed technique, a $p^+$-type base region is provided at the bottom of the trench, in a striped shape parallel to the trench.

FIGS. 29 and 30 are cross-sectional views of a structure of a conventional silicon carbide semiconductor device. The conventional silicon carbide semiconductor device depicted in FIG. 29 includes at a front surface (surface on a p-type base layer 106 side) side of a semiconductor base (hereinafter, silicon carbide base) 200 containing silicon carbide, a MOS gate having a typical trench gate structure. The silicon carbide base (semiconductor chip) 200 is formed by sequentially forming by epitaxial growth on an $n^+$-type supporting substrate (hereinafter, $n^+$-type silicon carbide substrate) 101 containing silicon carbide, silicon carbide layers constituting an $n^-$-type drift layer 102, an n-type region 105 that is a current diffusion region, and the p-type base layer 106.

In the n-type region 105, a first $p^+$-type region 103 is selectively formed so as to entirely cover a bottom of a trench 1018. The first $p^+$-type region 103 is provided at a depth not reaching the $n^-$-type drift layer 102. Further, in the n-type region 105, a lower second $p^+$-type base region 104a and an upper second $p^+$-type base region 104b are selectively provided between (mesa part) the trench 1018 and an adjacent trench 1018. The lower second $p^+$-type base region 104a and the first $p^+$-type base region 103 may be formed concurrently. The upper second $p^+$-type base region 104b is provided so as to be in contact with the p-type base layer 106. Reference numerals 107, 108, 109, 1010, 1011, and 1012 are an $n^+$-type source region, a $p^+$-type contact region, a gate insulating film, a gate electrode, an interlayer insulating film, and a source electrode, respectively.

In the vertical MOSFET depicted in FIG. 29, a pn junction of the first $p^+$-type region 103 and the n-type region 105 is positioned deeper than the trench 1018. Therefore, electric field concentrates at a boundary of the first $p^+$-type region 103 and the n-type region 105, enabling electric field concentration at the bottom of the trench 1018 to be mitigated. In a vertical MOSFET of a similar structure and depicted in FIG. 30, in place of the first $p^+$-type region 103, an oxide film 1019 under the trench 1018 is made thicker than an oxide film 109 at inner walls of the trench 1018, enabling electric field concentration at the bottom of the trench 1018 to be mitigated.

SUMMARY OF THE INVENTION

According to an embodiment of the present invention, a silicon carbide semiconductor device includes a first semiconductor layer of a first conductivity type provided on a front surface of a silicon carbide substrate of the first conductivity type; a second semiconductor layer of the first conductivity type provided on a surface of the first semiconductor layer, an impurity concentration of the second semiconductor layer being higher than an impurity concentration of the first semiconductor layer; a third semiconductor layer of a second conductivity type provided on a surface of the second semiconductor layer; a fourth semiconductor layer of the first conductivity type selectively provided at a surface of the third semiconductor layer; a fifth semiconductor layer of the second conductivity type selectively provided at the surface of the third semiconductor layer; a trench penetrating the fourth semiconductor layer and the third semiconductor layer, and reaching the second semiconductor layer; a gate electrode provided in the trench, via a gate insulating film; a first electrode in contact with the fourth semiconductor layer and the fifth semiconductor layer; a second electrode provided at a rear surface of the silicon carbide substrate; a sixth semiconductor layer of the second conductivity type selectively disposed in the second semiconductor layer so as to be in contact with a side wall of the trench and the third semiconductor layer; and a seventh semiconductor layer of the second conductivity type provided so as to be in contact with the sixth semiconductor layer and a part of the trench, the seventh semiconductor layer crossing the trench in a direction orthogonal to the trench. A mathematical area not including the sixth semiconductor layer, as viewed from a top, is at least two times greater than a mathematical area including the sixth semiconductor layer.

In the embodiment, the silicon carbide semiconductor device further includes an eighth semiconductor layer of the second conductivity type, the eighth semiconductor layer being in contact with a part of the seventh semiconductor layer and an entire bottom of the trench, the eighth semiconductor layer being farther from the second electrode than is the seventh semiconductor layer.

In the embodiment, the sixth semiconductor layer is selectively disposed in a plane above the seventh semiconductor layer, along a line parallel to the side wall of the trench.

In the embodiment, the sixth semiconductor layer is selectively disposed in a plane above the seventh semiconductor layer, in a diamond-shape with respect to the side wall of the trench.

In the embodiment, the sixth semiconductor layer is selectively disposed in a plane above the seventh semiconductor layer, so as to be diagonal with respect to the side wall of the trench.

In the embodiment, the sixth semiconductor layer is repeatedly disposed at an interval of at least 10 μm, along a direction orthogonal to the trench.

According to another embodiment, a silicon carbide semiconductor device includes a first semiconductor layer of a first conductivity type provided on a front surface of a silicon carbide substrate of the first conductivity type; a second semiconductor layer of the first conductivity type provided on a surface of the first semiconductor layer, an impurity concentration of the second semiconductor layer being higher than an impurity concentration of the first semiconductor layer; a third semiconductor layer of a second conductivity type provided on a surface of the second semiconductor layer; a fourth semiconductor layer of the first conductivity type selectively provided at a surface of the third semiconductor layer; a fifth semiconductor layer of the second conductivity type selectively provided at the surface of the third semiconductor layer; a trench penetrating the fourth semiconductor layer and the third semiconductor layer, and reaching the second semiconductor layer; a first insulating film in contact with a side wall of the trench and the third semiconductor layer; a gate electrode provided in the trench, via the first insulating film; a first electrode in contact with the fifth semiconductor layer and the fourth semiconductor layer; a second electrode provided at a rear surface of the silicon carbide substrate; a sixth semiconductor layer of the second conductivity type selectively disposed in the second semiconductor layer so as to be in contact with the side wall of the trench and the third semiconductor layer; a seventh semiconductor layer of the second conductivity type provided so as to be in contact with the sixth semiconductor layer and a part of the trench, the seventh semiconductor layer crossing the trench in a direction orthogonal to the trench; and a second insulating film in contact with at least a part of a bottom of the trench, a thickness of the second insulating film being at least 1.1 times thicker than a thickness of the first insulating film. A mathematical area not including the sixth semiconductor layer, as viewed from a top, is at least two times greater than a mathematical area including the sixth semiconductor layer.

In the embodiment, the sixth semiconductor layer is selectively disposed in a plane above the seventh semiconductor layer, along a line parallel to the side wall of the trench.

In the embodiment, the sixth semiconductor layer is selectively disposed in a plane above the seventh semiconductor layer, in a diamond-shape with respect to the side wall of the trench.

In the embodiment, the sixth semiconductor layer is selectively disposed in a plane above the seventh semiconductor layer, so as to be diagonal with respect to the side wall of the trench.

In the embodiment, the sixth semiconductor layer is repeatedly disposed at an interval of at least 10 μm, along a direction orthogonal to the trench.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 5 is a cross-sectional view of the structure of the silicon carbide semiconductor device according to the first embodiment, along cutting line E-E' in FIGS. 6 and 7;

FIG. 6 is a top view of the silicon carbide semiconductor device according to the first embodiment, along cutting line a-a' in FIGS. 1 to 4;

FIG. 7 is a top view of the structure of the silicon carbide semiconductor device according to the first embodiment, along cutting line b-b' in FIGS. 1 to 4;

DETAILED DESCRIPTION OF THE INVENTION

Figure 1:
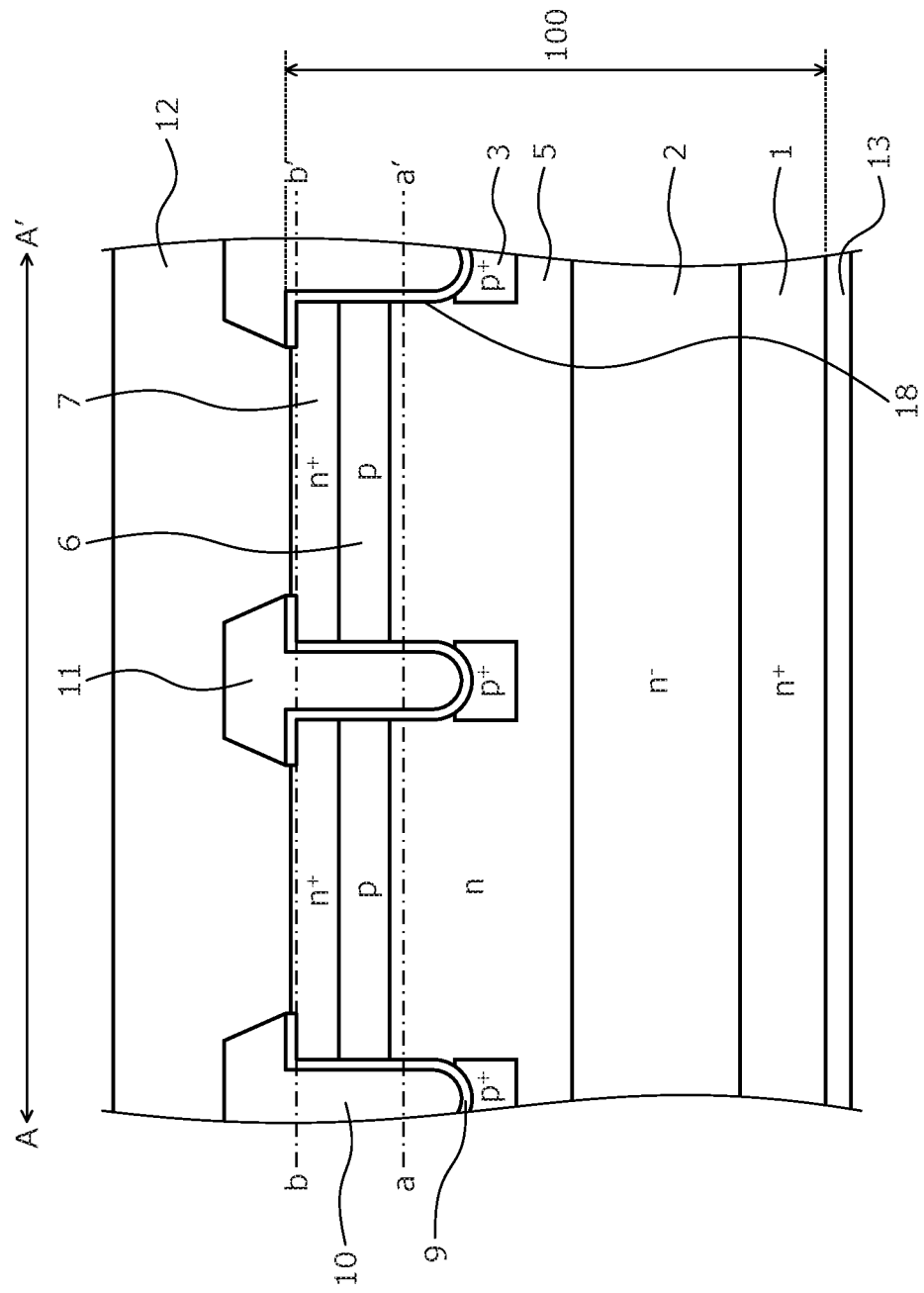
FIG. 1 is a cross-sectional view of a structure of a silicon carbide semiconductor device according to a first embodiment, along cutting line A-A' in FIGS. 6 and 7.

First, problems associated with the related arts will be described. In the conventional structures described above, when a cell pitch is to be reduced to less than 4.0 μm, a dimension of the first $p^+$-type region 103, the lower second $p^+$-type region 104a, and the upper second $p^+$-type region 104b has to be reduced to less than 1.0 μm. Therefore, higher precision photolithography becomes necessary, increasing the degree of manufacturing difficulty. On the other hand, if the first $p^+$-type region 103, the lower second $p^+$-type region 104a, and the upper second $p^+$-type region 104b are not provided, electric field concentration at the bottom of the trench cannot be mitigated and a target breakdown voltage cannot be realized.

Embodiments of a silicon carbide semiconductor device and method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 2:
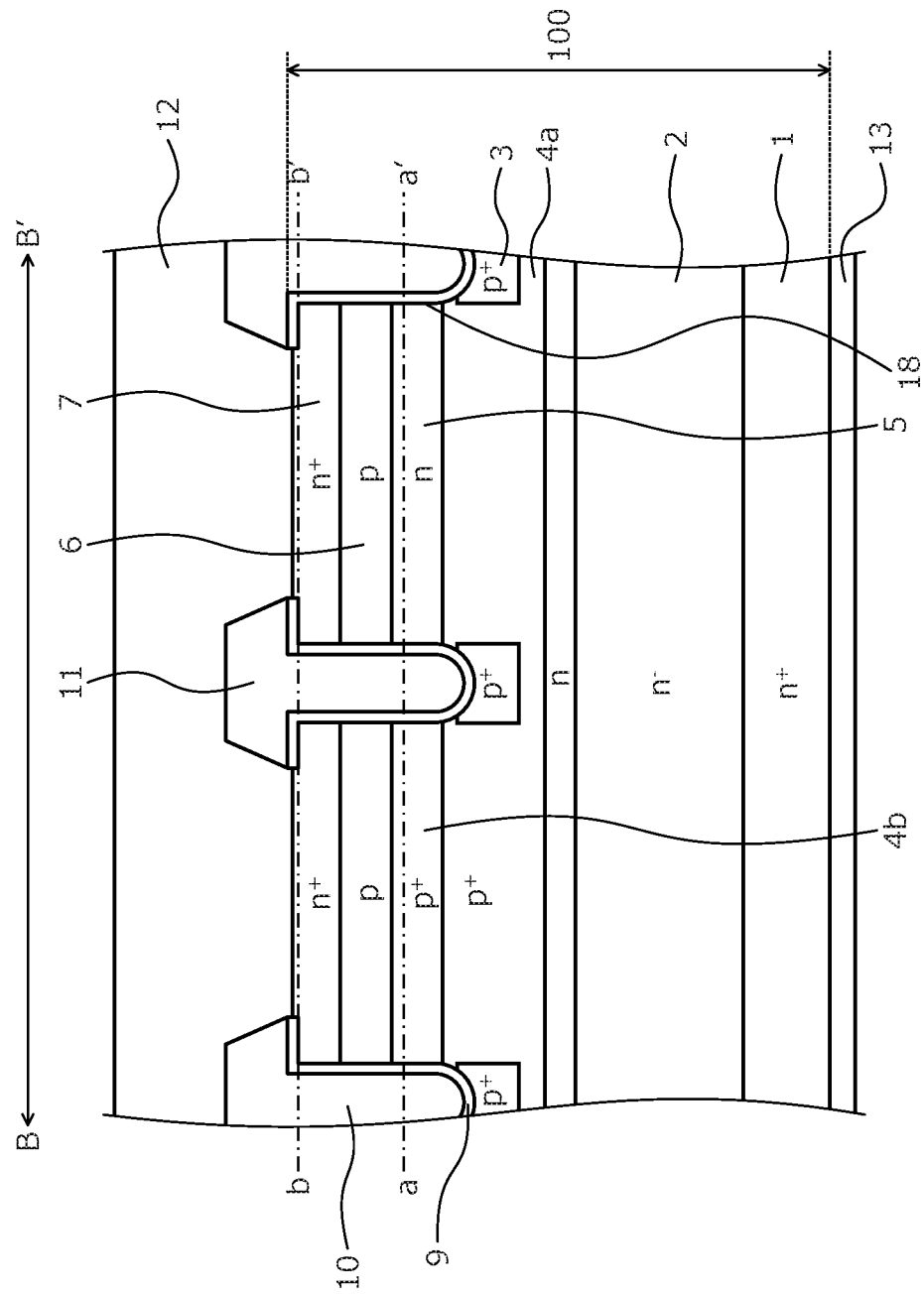
FIG. 2 is a cross-sectional view of the structure of the silicon carbide semiconductor device according to the first embodiment, along cutting line B-B' in FIGS. 6 and 7.
Figure 3:
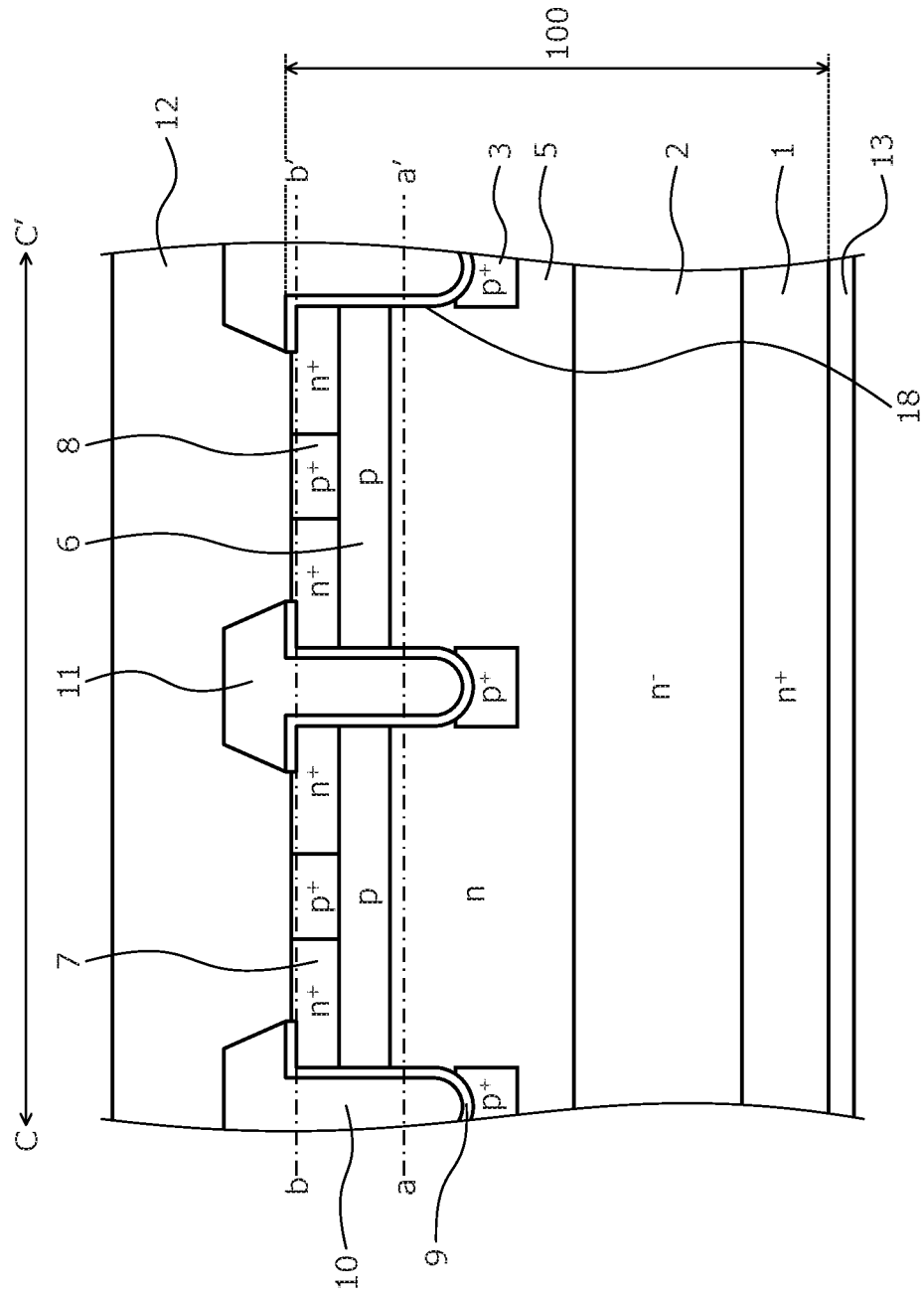
FIG. 3 is a cross-sectional view of the structure of the silicon carbide semiconductor device according to the first embodiment, along cutting line C-C' in FIGS. 6 and 7.
Figure 4:
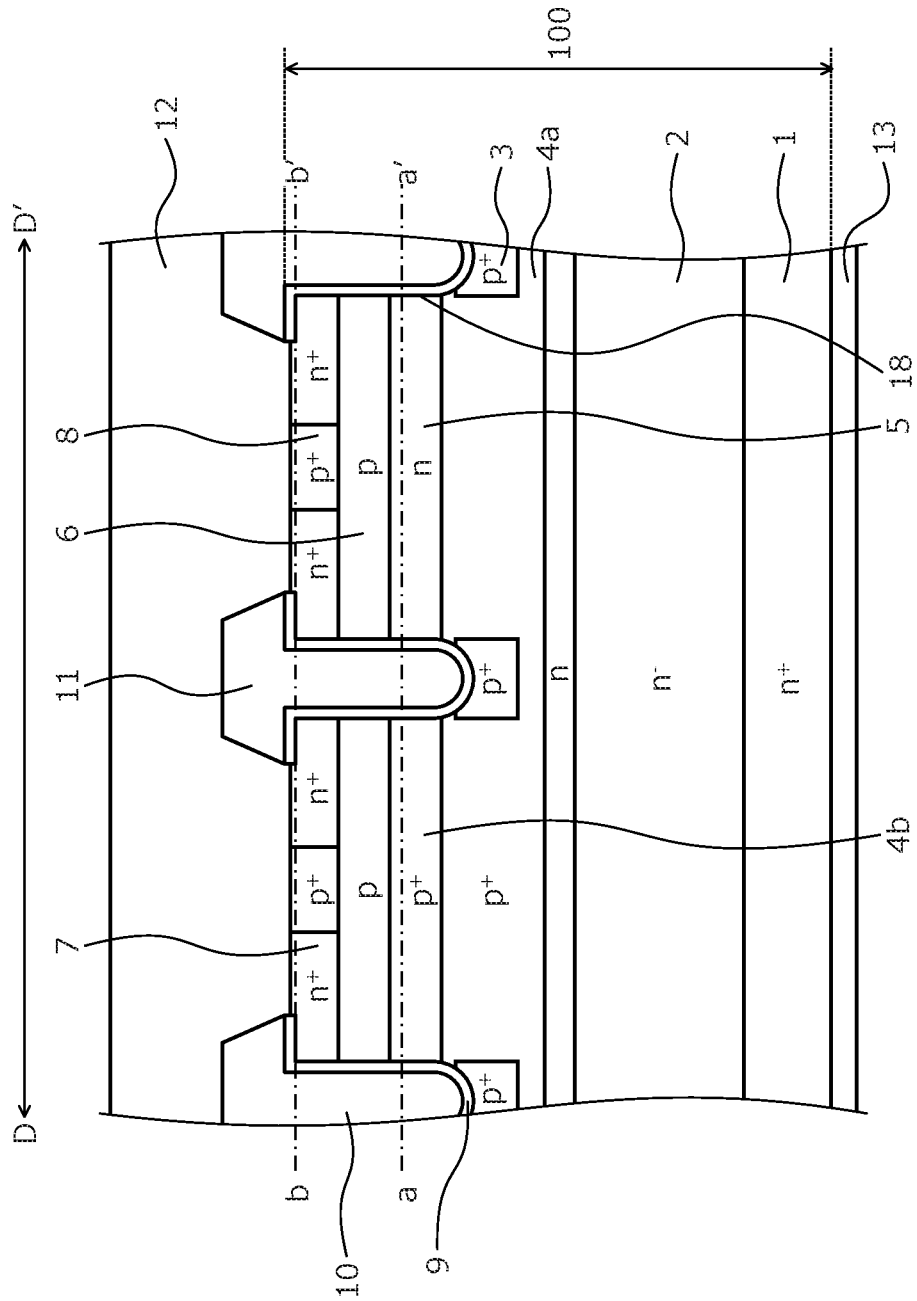
FIG. 4 is a cross-sectional view of the structure of the silicon carbide semiconductor device according to the first embodiment, along cutting line D-D' in FIGS. 6 and 7.

A semiconductor device according to embodiments of the present invention is configured using a semiconductor material (hereinafter, wide bandgap semiconductor material) having a bandgap that is wider than a bandgap of silicon. Here, a structure of a semiconductor device (silicon carbide semiconductor device) that uses, for example, silicon carbide (SiC) as wide bandgap semiconductor material will be described as an example. FIGS. 1, 2, 3, and 4 are cross-sectional views of the structure of the silicon carbide semiconductor device according to a first embodiment. FIG. 1 is a cross-sectional view of the silicon carbide semiconductor device along cutting line A-A' in FIGS. 6 and 7, which are top views of the silicon carbide semiconductor device. FIG. 2 is a cross-sectional view along cutting line B-B' in FIGS. 6 and 7; FIG. 3 is a cross-sectional view along cutting ling C-C' in FIGS. 6 and 7; and FIG. 4 is a cross-sectional view along cutting line D-D' in FIGS. 6 and 7. In FIGS. 1 to 4, only 2 unit cells (functional units of an element) are depicted while other unit cells adjacent to these unit cells are not depicted (similarly in FIGS. 15 to 18, and FIGS. 20 to 23). The silicon carbide semiconductor device according to the first embodiment depicted in FIGS. 1 to 4 is a MOSFET that includes a MOS gate at a front surface (surface on a p-type base layer 6 side) side of a semiconductor base (silicon carbide base: semiconductor chip) 100 containing silicon carbide.

The silicon carbide base 100 is formed by sequentially forming by epitaxial growth on an $n^+$-type supporting substrate ($n^+$-type silicon carbide substrate) 1 containing silicon carbide, silicon carbide layers constituting an type drift layer (first semiconductor layer) 2 and a p-type base layer (third semiconductor layer) 6. The MOS gate is constituted by the p-type base layer 6, an $n^+$-type source region (fourth semiconductor layer) 7, a $p^+$-type contact region 8, a trench 18, a gate insulating film 9, and a gate electrode 10. In particular, in a surface layer on a source side (side toward a source electrode 12) of the $n^-$-type drift layer 2, an n-type region 5 is provided so as to be in contact with the p-type base layer 6. The n-type region 5 is a so-called current diffusion layer or a current spreading layer (CSL) that reduces carrier spread resistance. The n-type region 5, for example, is provided uniformly along a direction (hereinafter, lateral direction) parallel to a base front surface (front surface of the silicon carbide base 100).

In the n-type region 5, a first $p^+$-type region 3, a lower second $p^+$-type region 4a, and an upper second $p^+$-type region 4b are selectively provided. The first $p^+$-type region 3 is provided so as to be in contact with a bottom of the trench 18 described hereinafter. The first $p^+$-type region 3 is provided from a position deeper toward a drain electrode 13 than is an interface of the p-type base layer 6 and the n-type region 5, to a depth not reaching an interface of the n-type region 5 and the $n^-$-type drift layer 2. Provision of the first $p^+$-type region 3 enables formation of a pn junction between the first $p^+$-type region 3 and the n-type region 5, near the bottom of the trench 18. The first $p^+$-type region 3 has an impurity concentration that is higher than an impurity concentration of the p-type base layer 6.

Further, a width of the first p$^+$-type region 3 is less than or equal to a width of the trench 18. Therefore, the first p$^+$-type region 3 may be formed by self-alignment, i.e., formed using a mask that is used when forming the trench 18. In this manner, the first p$^+$-type region 3 is formed using the same mask and therefore, the first p$^+$-type region 3 and the trench 18 are formed without deviation in the formation position (alignment).

The lower second p$^+$-type region 4a is selectively provided separated from the n$^-$-type drift layer 2 and so as to be in contact with the upper second p$^+$-type region 4b. An interface of the lower second p$^+$-type region 4a and the upper second p$^+$-type region 4b is provided closer to the source electrode 12 than is the bottom of the trench 18. Further, the lower second p$^+$-type region 4a is disposed in a striped shape orthogonal to a width direction of the trench 18. FIG. 6 is a top view of the silicon carbide semiconductor device according to the first embodiment, along cutting line a-a' in FIGS. 1 to 4. In FIG. 6, a position indicated by reference character T1 is a region where the lower second p$^+$-type region 4a is provided. Therefore, in FIGS. 1 and 3, while the lower second p$^+$-type region 4a is not present, in FIGS. 2 and 4, the lower second p$^+$-type region 4a is present.

The upper second p$^+$-type region 4b is provided so as to be in contact with the p-type base layer 6 and the lower second p$^+$-type region 4a. In this manner, the upper second p$^+$-type region 4b is provided orthogonal to a depth direction of the trench 18. Therefore, after the upper second p$^+$-type region 4b is formed, the trench 18 may be formed without deviation in the alignment of the upper second p$^+$-type region 4b and the trench 18.

Further, the upper second p$^+$-type region 4b is in contact with the trench 18 and therefore, regions S2 (refer to FIG. 6) between the p-type base layer 6 and the first p$^+$-type region 3 and in which the upper second p$^+$-type region 4b is provided are regions that do not form a channel region and through which current does not flow even in an ON state. Therefore, between the p-type base layer 6 and the first p$^+$-type region 3, regions S1 (refer to FIG. 6) are also provided in which the upper second p$^+$-type region 4b is not provided, i.e., in which the n-type region 5 is provided.

When viewed from a top, when a total mathematical area of the regions S2 is large, in the ON state, current does not flow in many regions, whereby performance degrades. Therefore, a total mathematical area of the regions S1 as viewed from the top may be 2 times the total mathematical area of the regions S2 or more. For example, as depicted in FIG. 6, the total mathematical area of the regions S1 as viewed from the top is 4 times the total mathematical area of the regions S2 as viewed from the top. Here, the total mathematical areas of the regions S1, S2 as viewed from the top are the total mathematical areas of the regions S1, S2 as viewed from the front surface of the silicon carbide base 100. In the description hereinafter, when referring to the total mathematical area, "as viewed from the top" will be omitted.

Figure 8A:
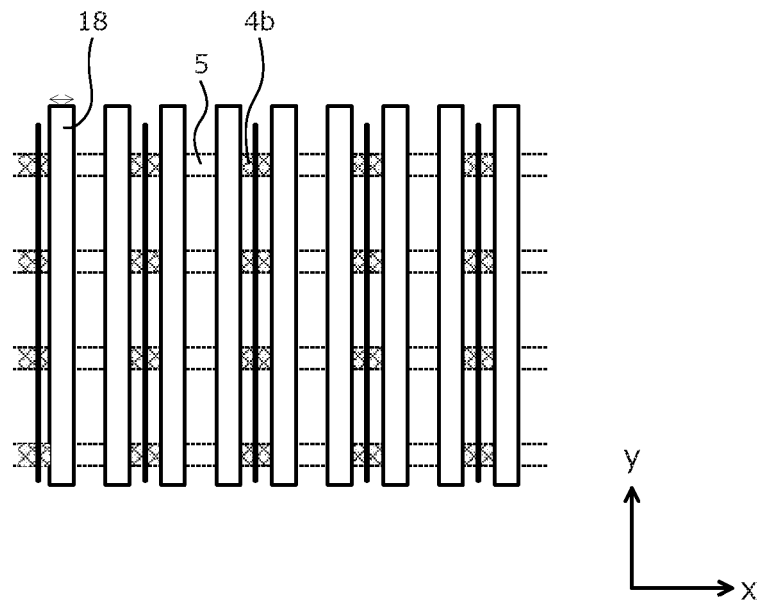
FIG. 8A is a top view of another example of arrangement of an upper second $p^+$-type region of the silicon carbide semiconductor device according to the first embodiment.
Figure 8B:
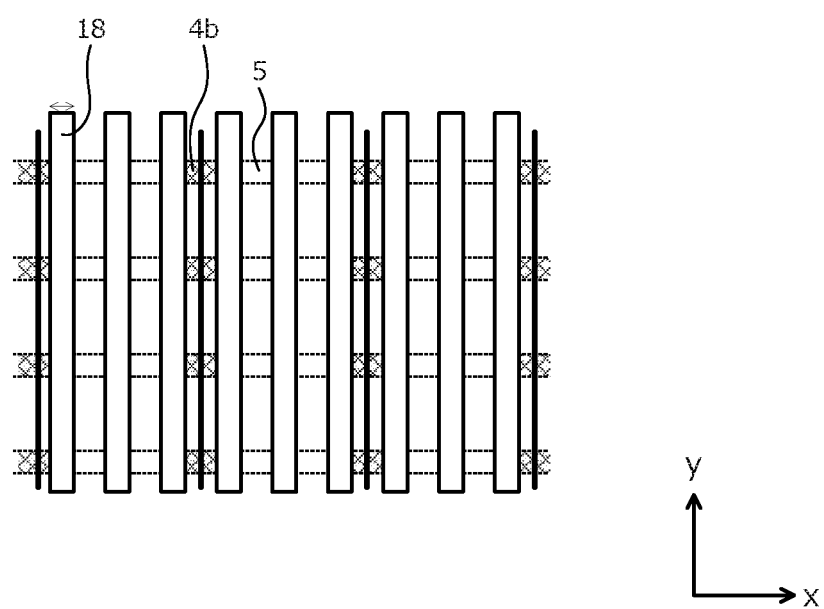
FIG. 8B is a top view of another example of arrangement of an upper second $p^+$-type region of the silicon carbide semiconductor device according to the first embodiment.

Arrangement of the region S1 and the region S2 is not limited to a diagonal arrangement of the region S2 as depicted in FIG. 6. FIGS. 8A, 8B, 8C, and 8D are top views of other examples of arrangement of the upper second p$^+$-type region of the silicon carbide semiconductor device according to the first embodiment. FIG. 8A depicts an arrangement in which along a direction (x axis direction) orthogonal to a side wall of the trench 18, the region S1 and the region S2 are disposed to alternate each other singularly, while along a direction (y axis direction) parallel to side walls of the trench 18, the region S1 is disposed consecutively and the region S2 is disposed consecutively. In FIG. 8A, the total mathematical area of the regions S1 is 2 times the total mathematical area of the regions S2. FIG. 8B depicts an arrangement in which along the direction (x axis direction) orthogonal to the trench 18, the region S1 is disposed every two of the regions S2, while along the direction (y axis direction) parallel to the side walls of the trench 18, the region S1 is disposed consecutively and the region S2 is disposed consecutively. In FIG. 8B, the total mathematical area of the regions S1 is 4 times the total mathematical area of the regions S2.

Figure 8C:
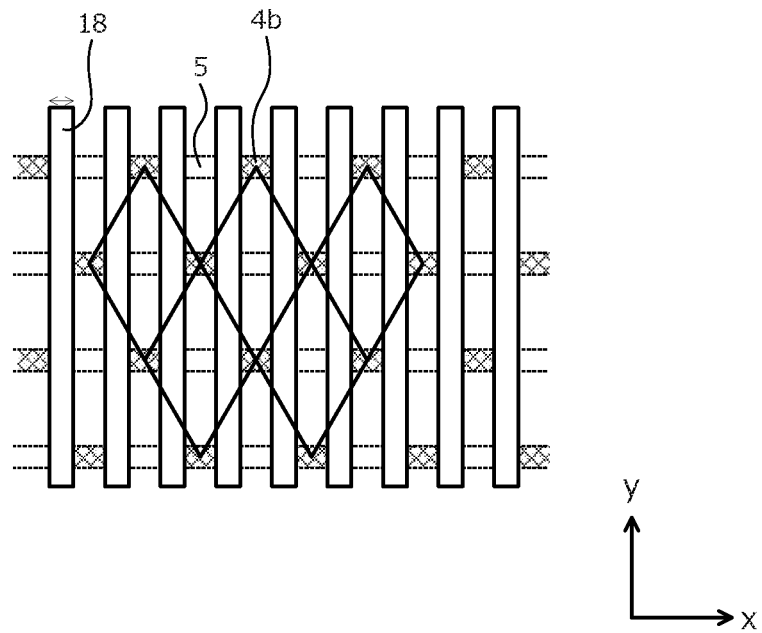
FIG. 8C is a top view of another example of arrangement of an upper second $p^+$-type region of the silicon carbide semiconductor device according to the first embodiment.
Figure 8D:
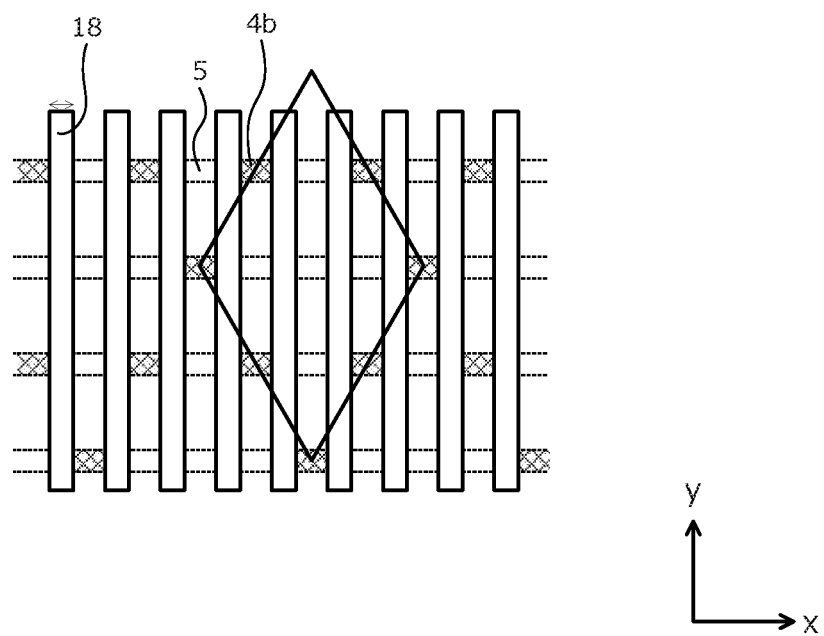
FIG. 8D is a top view of another example of arrangement of an upper second $p^+$-type region of the silicon carbide semiconductor device according to the first embodiment.

FIG. 8C depicts an arrangement in which along the direction (x axis direction) orthogonal to the trench 18, the region S1 and the region S2 are disposed alternating each other singularly, while along the direction (y axis direction) parallel to the side walls of the trench 18, the region S1 and the region S2 are also disposed alternating each other singularly, whereby the regions S2 are disposed in a staggered manner. In FIG. 8C, the total mathematical area of the regions S1 is 2 times the total mathematical area of the regions S2. FIG. 8D depicts an arrangement in which in first rows orthogonal (x axis direction) to the trench 18 and in first columns parallel to (y axis direction) the side walls of the trench 18, the region S1 and the region S2 are disposed alternating each other singularly, and in second rows each between adjacent first rows and orthogonal (x axis direction) to the trench 18 and in second columns each between adjacent first columns and parallel to (y axis direction) the side walls of the trench 18, the region S2 is disposed every three of the regions S1, whereby the regions S2 are disposed in a widely staggered manner. In FIG. 8D, the total mathematical area of the regions S1 is 4 times the total mathematical area of the regions S2.

In the p-type base layer 6, the n$^+$-type source region 7 and the p$^+$-type contact region 8 are each selectively provided in contact with each other. A depth of the p$^+$-type contact region 8 may be, for example, equal to a depth of the n$^+$-type source region 7 or deeper.

FIG. 7 is a top view of the structure of the silicon carbide semiconductor device according to the first embodiment, along cutting line b-b' in FIGS. 1 to 4. As depicted in FIG. 7, the p$^+$-type contact region 8 is provided partially along the direction (y axis direction) parallel to a side wall of the trench 18.

FIG. 1 is a cross-sectional view of the structure of the silicon carbide semiconductor device according to the first embodiment, along cutting line A-A' in FIGS. 6 and 7. Therefore, in the cross-sectional view in FIG. 1, the lower second p$^+$-type region 4a and the upper second p$^+$-type region 4b are not present and the p$^+$-type contact region 8 is also not present. FIG. 2 is a cross-sectional view of the structure of the silicon carbide semiconductor device according to the first embodiment, along cutting line B-B' in FIGS. 6 and 7. Therefore, in the cross-sectional view in FIG. 2, the lower second p$^+$-type region 4a and the upper second p$^+$-type region 4b are present while the p$^+$-type contact region 8 is not present. FIG. 3 is a cross-sectional view of the structure of the silicon carbide semiconductor device according to the first embodiment, along cutting line C-C' in FIGS. 6 and 7. Therefore, in the cross-sectional view in FIG. 3, the lower second p$^+$-type region 4a and the upper second p$^+$-type region 4b are not present while the p$^+$-type contact region 8 is present. FIG. 4 is a cross-sectional view of the structure of the silicon carbide semiconductor device according to the first embodiment, along cutting line D-D' in FIGS. 6 and 7. Therefore, in the cross-sectional view in FIG. 4, the lower second p$^+$-type region 4a and the upper second p$^+$-type region 4b are present and the p$^+$-type contact region 8 is also present. FIG. 5 is a cross-sectional view of the structure of the silicon carbide semiconductor device according to the first embodiment, along cutting line E-E' in FIGS. 6 and 7. FIG. 5 is a cross-sectional view of a part in which the trench 18 is present, and the three upper second p$^+$-type regions 4b in FIG. 5 correspond to the three regions from the top in FIG. 6, indicated by T1.

The trench 18 penetrates the n$^+$-type source region 7 and the p-type base layer 6 from the base front surface and reaches the n-type region 5 and the lower second p$^+$-type region 4a. In the trench 18, the gate insulating film 9 is provided along side walls of the trench 18 and the gate electrode 10 is provided on the gate insulating film 9. An end of the gate electrode 10 toward the source side may or may not protrude outwardly from the base front surface. The gate electrode 10 is electrically connected at a non-depicted part to a gate pad (not depicted). An interlayer insulating film 11 is provided at the base front surface entirely so as to cover the gate electrodes 10 embedded in the trenches 18.

The source electrode (first electrode) 12 is in contact with the n$^+$-type source region 7 and the p$^+$-type contact region 8 via contact holes opened in the interlayer insulating film 11 and is electrically insulated from the gate electrode 10 by the interlayer insulating film 11. A barrier metal that prevents diffusion of metal atoms, for example, from the source electrode 12 toward the gate electrode 10 may be provided between the source electrode 12 and the interlayer insulating film 11. On the source electrode 12, a source electrode pad (not depicted) is provided. At a rear surface (rear surface of the n$^+$-type silicon carbide substrate 1 constituting an n$^+$-type drain region) of the silicon carbide base 100, the drain electrode (second electrode) 13 is provided.

Figure 9:
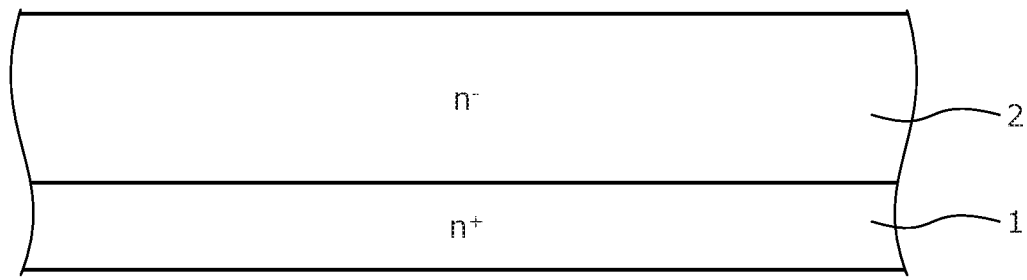
FIG. 9 is a cross-sectional view of the silicon carbide semiconductor device according to the first embodiment during manufacture.

A method of manufacturing the silicon carbide semiconductor device according to the first embodiment will be described. FIGS. 9, 10, 11, 12, 13, and 14 are cross-sectional views of the silicon carbide semiconductor device according to the first embodiment during manufacture. First, the n$^+$-type silicon carbide substrate 1 constituting the n$^+$-type drain region is prepared. Next, on the front surface of the n$^+$-type silicon carbide substrate 1, the n$^-$-type drift layer 2 is formed by epitaxial growth. For example, conditions of the epitaxial growth for forming the n$^-$-type drift layer 2 may be set so that an impurity concentration of the n$^-$-type drift layer 2 becomes about $3\times10^{15}$/cm$^3$. The state up to here is depicted in FIG. 9.

Figure 10:
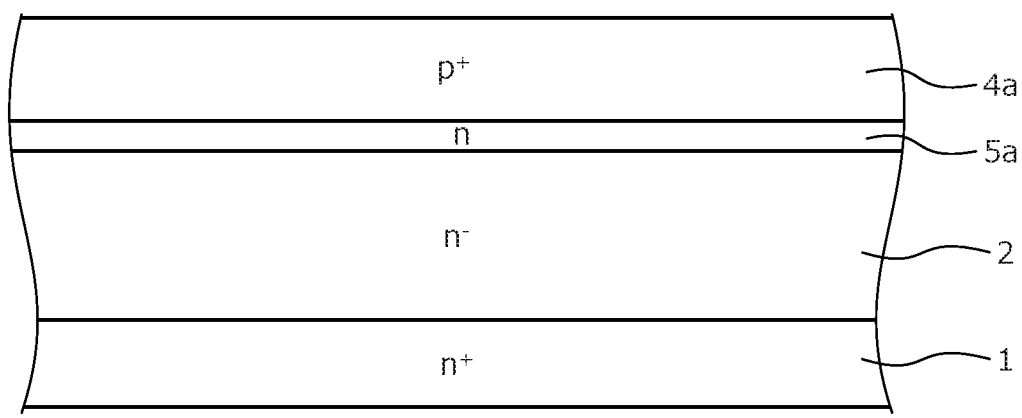
FIG. 10 is a cross-sectional view of the silicon carbide semiconductor device according to the first embodiment during manufacture.

Next, on the n$^-$-type drift layer 2, a lower n-type region 5a is formed by epitaxial growth. For example, conditions of the epitaxial growth for forming the lower n-type region 5a may be set so that an impurity concentration of the lower n-type region 5a becomes about $1\times10^{17}$/cm$^3$. The lower n-type region 5a is a portion of the n-type region 5. Next, the lower second p$^+$-type region 4a is selectively formed in a surface layer of the lower n-type region 5a by photolithography and ion implantation of a p-type impurity. For example, a dose amount at the time of the ion implantation for forming the lower second p$^+$-type region 4a may be set so that an impurity concentration thereof becomes about $5\times10^{18}$/cm$^3$. The state up to here is depicted in FIG. 10.

Figure 11:
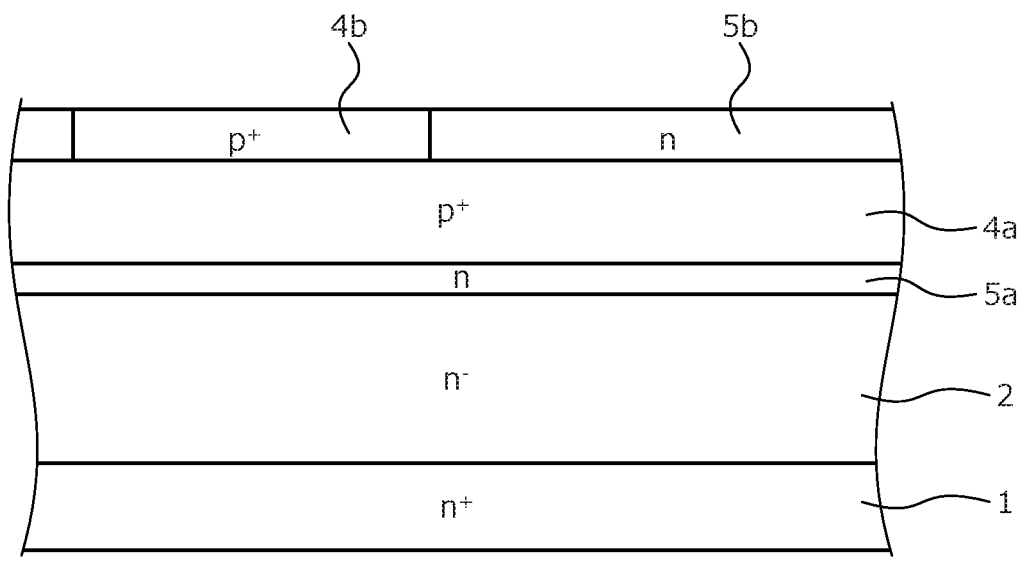
FIG. 11 is a cross-sectional view of the silicon carbide semiconductor device according to the first embodiment during manufacture.

Next, on the lower n-type region 5a and the lower second p$^+$-type region 4a, an upper n-type region 5b is formed by epitaxial growth. For example, conditions of the epitaxial growth for forming the upper n-type region 5b may be set so that an impurity concentration of the lower n-type region 5b becomes about equal to the impurity concentration of the lower n-type region 5a. The upper n-type region 5b is a portion of the n-type region 5; and the lower n-type region 5a and the upper n-type region 5b combined form the n-type region 5. Next, the upper second p$^+$-type region 4b is selectively formed in a surface layer of the upper n-type region 5b by photolithography and ion implantation of a p-type impurity. For example, a dose amount at the time of the ion implantation for forming the upper second p$^+$-type region 4b may be set so that an impurity concentration of the upper second p$^+$-type region 4b becomes about equal to the impurity concentration of the lower second p$^+$-type region 4a. The state up to here is depicted in FIG. 11.

Next, on the upper n-type region 5b and upper second p$^+$-type region 4b, the p-type base layer 6 is formed by epitaxial growth. For example, conditions of the epitaxial growth for forming the p-type base layer 6 may be set so that an impurity concentration of the p-type base layer 6 becomes about $4\times10^{17}$/cm$^3$.

Figure 12:
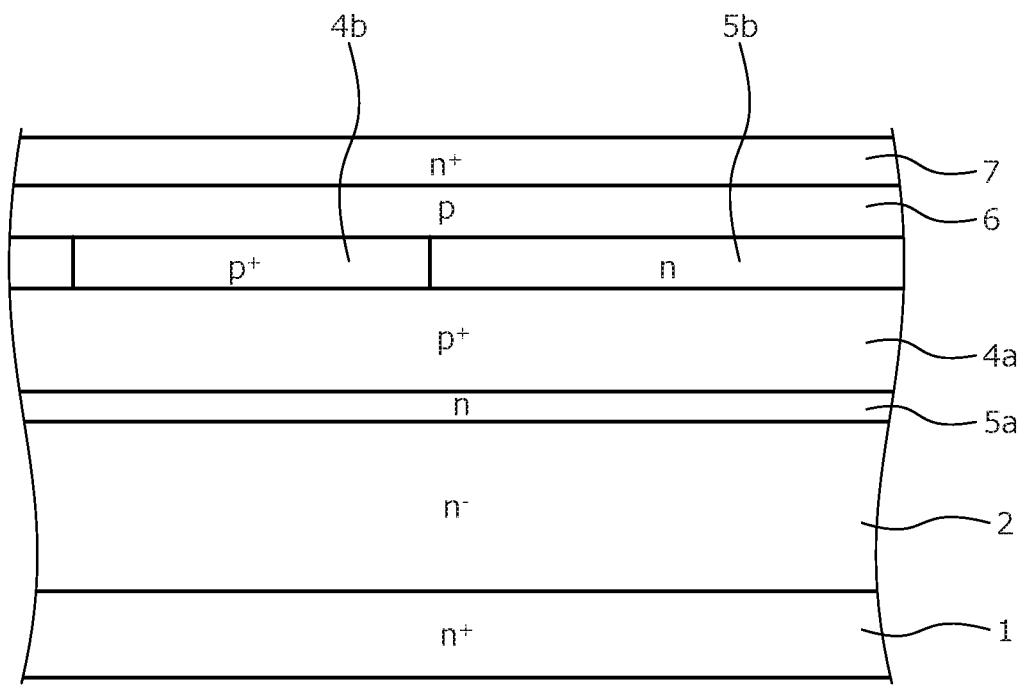
FIG. 12 is a cross-sectional view of the silicon carbide semiconductor device according to the first embodiment during manufacture.

Next, the n$^+$-type source region 7 is selectively formed in a surface layer of the p-type base layer 6 by photolithography and ion implantation of an n-type impurity. For example, a dose amount at the time of the ion implantation for forming the n$^+$-type source region 7 may be set so that an impurity concentration thereof becomes about $3\times10^{20}$/cm$^3$. The state up to here is depicted in FIG. 12.

Figure 13:
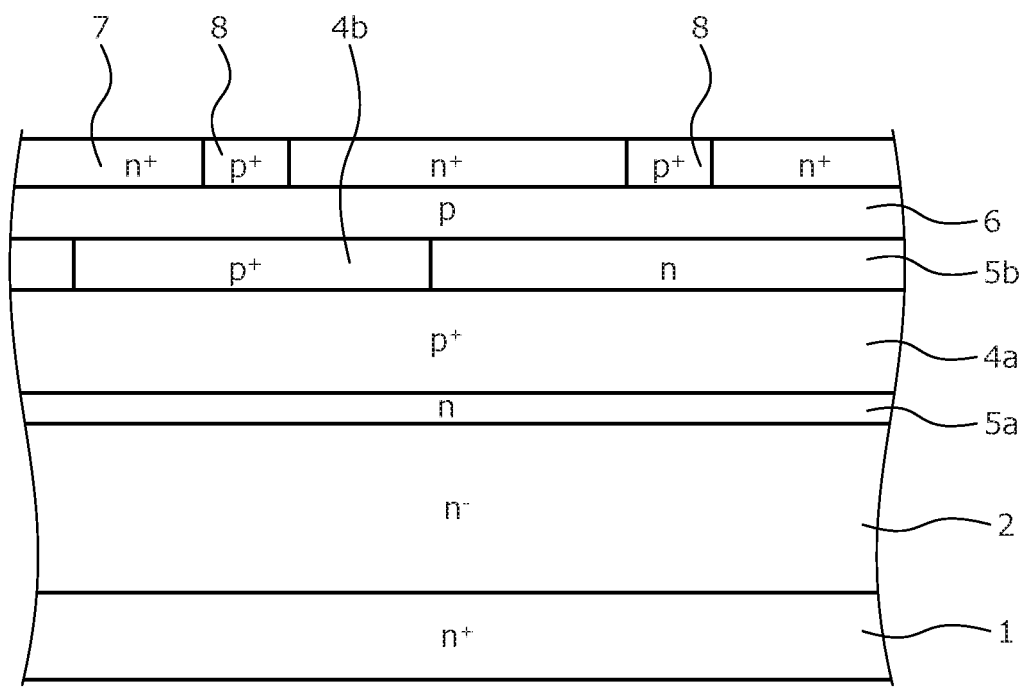
FIG. 13 is a cross-sectional view of the silicon carbide semiconductor device according to the first embodiment during manufacture.

Next, the p$^+$-type contact region 8 is selectively formed in the surface layer of the p-type base layer 6 so as to be in contact with the n$^+$-type source region 7, the p$^+$-type contact region 8 being formed by photolithography and ion implantation of a p-type impurity. For example, a dose amount at the time of the ion implantation for forming the p$^+$-type contact region 8 may be set so that an impurity concentration thereof becomes about $3\times10^{20}$/cm$^3$. A sequence in which the n$^+$-type source region 7 and the p$^+$-type contact region 8 are formed may be interchanged. After all ion implantations have been completed, activation annealing is performed. The state up to here is depicted in FIG. 13.

Figure 14:
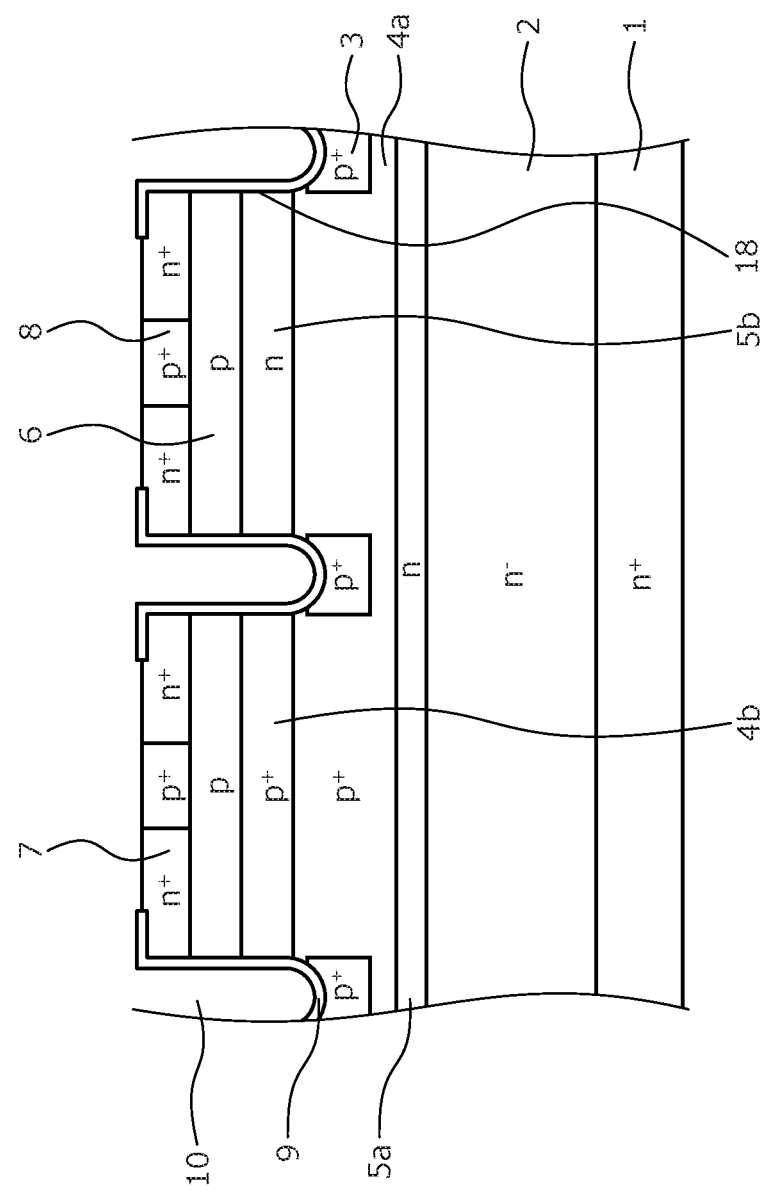
FIG. 14 is a cross-sectional view of the silicon carbide semiconductor device according to the first embodiment during manufacture.

Next, by photolithography and etching, each trench 18 is formed penetrate the n$^+$-type source region 7 and the p-type base layer 6, and reach the n-type region 5 and the lower second p$^+$-type region 4a. Next, using a mask used at the time of trench formation, the first p$^+$-type region 3 is selectively formed at the bottom of the trench 18 by ion implantation of a p-type impurity. At this time, the first p$^+$-type region 3 is formed so that the first p$^+$-type region 3 does not contact the lower n-type region 5a. For example, a dose amount at the time of the ion implantation for forming the first p$^+$-type region 3 may be set so that an impurity concentration of the first p$^+$-type region 3 becomes about equal to the impurity concentration of the lower second p$^+$-type region 4a. Further, an oxide film is used as the mask at the time of trench formation. After trench etching, isotropic etching for removing damage of the trench 18 and hydrogen annealing for rounding the bottom of the trench 18 and corners of openings of the trench 18 may be performed. Either the isotropic etching or the hydrogen annealing may be performed. Further, after performing the isotropic etching, the hydrogen annealing may be performed. The state up to here is depicted in FIG. 14.

Next, along the front surface of the silicon carbide base 100 and inner walls of the trench 18, the gate insulating film 9 is formed. Next, for example, poly-silicon is deposited and etched so as to be embedded in the trench 18, whereby the poly-silicon remains in the trench 18, becoming the gate electrode 10. At this time, the etching may be performed so that the poly-silicon remains in the trench 18 lower than the front surface of the silicon carbide base 100 or the etching may be performed so that the poly-silicon protrudes outside from the front surface of the silicon carbide base 100.

Next, the interlayer insulating film 11 is formed on the entire front surface of the silicon carbide base 100 so as to cover the gate electrodes 10. The interlayer insulating film 11 is formed using, for example, a non-doped silicate glass (NSG), a phosphosilicate glass (PSG), a borophosphosilicate glass (BPSG), a high temperature oxide (HTO), or any combination thereof. Next, the interlayer insulating film 11 and the gate insulating film 9 are patterned and contact holes are formed, exposing the $n^+$-type source region 7 and the $p^+$-type contact region 8.

Next, a barrier metal is formed and patterned so as to cover the interlayer insulating film 11 and again expose the $n^+$-type source region 7 and the $p^+$-type contact region 8. Next, the source electrode 12 is formed so as to be in contact with the $n^+$-type source region 7. The source electrode 12 may be formed so as cover the barrier metal or to remain only in the contact holes.

Next, the source electrode pad is formed so as to be embedded in the contact holes. A part of a metal layer deposited to form the source electrode pad may be used as the gate pad. At a rear surface of the $n^+$-type silicon carbide substrate 1, a metal film such as a nickel (Ni) film, a titanium (Ti) film, etc. is formed using sputtering deposition, as a contact part of the drain electrode 13. The metal film may be constituted by a stacked combination of multiple Ni and Ti films. Thereafter, annealing such as rapid thermal annealing (RTA) is performed so as to convert the metal film into a silicide and form an ohmic contact. Thereafter, for example, a thick film constituted by a Ti film, an Ni film, and a gold (Au) film sequentially stacked in order stated is formed by electron beam (EB) deposition, etc., whereby the drain electrode 13 is formed.

In the epitaxial growth and the ion implantation described, as an n-type impurity (n-type dopant), for example, nitrogen (N), phosphorus (P), arsenic (As), antimony (Sb), etc. that are n-types with respect to silicon carbide is used. As a p-type impurity (p-type dopant), for example, boron (B), aluminum (Al), gallium (Ga), indium (In), thallium (Tl), etc. that are p-types with respect to silicon carbide is used. In this manner, the MOSFET depicted in FIGS. 1 to 4 is completed.

As described, according to the first embodiment, the upper second $p^+$-type region is disposed orthogonally to the width direction of the trench and therefore, after formation of the upper second $p^+$-type region, the trench may be formed. As a result, deviations in the alignment of the upper second $p^+$-type region and the trench may be prevented. Thus, even when the cell pitch is decreased to be less than 4.0 μm, it becomes possible to form the upper second $p^+$-type region using photolithography of a same precision as that used conventionally. The upper second $p^+$-type region enables application of high electric field at the bottom of the trench to be suppressed, enabling a silicon carbide semiconductor device that realizes a target breakdown voltage to be provided.

Further, according to the first embodiment, the total mathematical area of regions between the p-type base layer and the first $p^+$-type region and in which the upper second $p^+$-type region is not provided is at least two times the total mathematical area of the regions between the p-type base layer and the first $p^+$-type region and in which the upper second $p^+$-type region is provided. As a result, the regions between the p-type base layer and the first $p^+$-type region and in which the upper second $p^+$-type region is not provided are regions through which current flows in the ON state and therefore, regions through which current flows in the ON state may be sufficiently established and degradation of the performance of the silicon carbide semiconductor device may be prevented.

Figure 15:
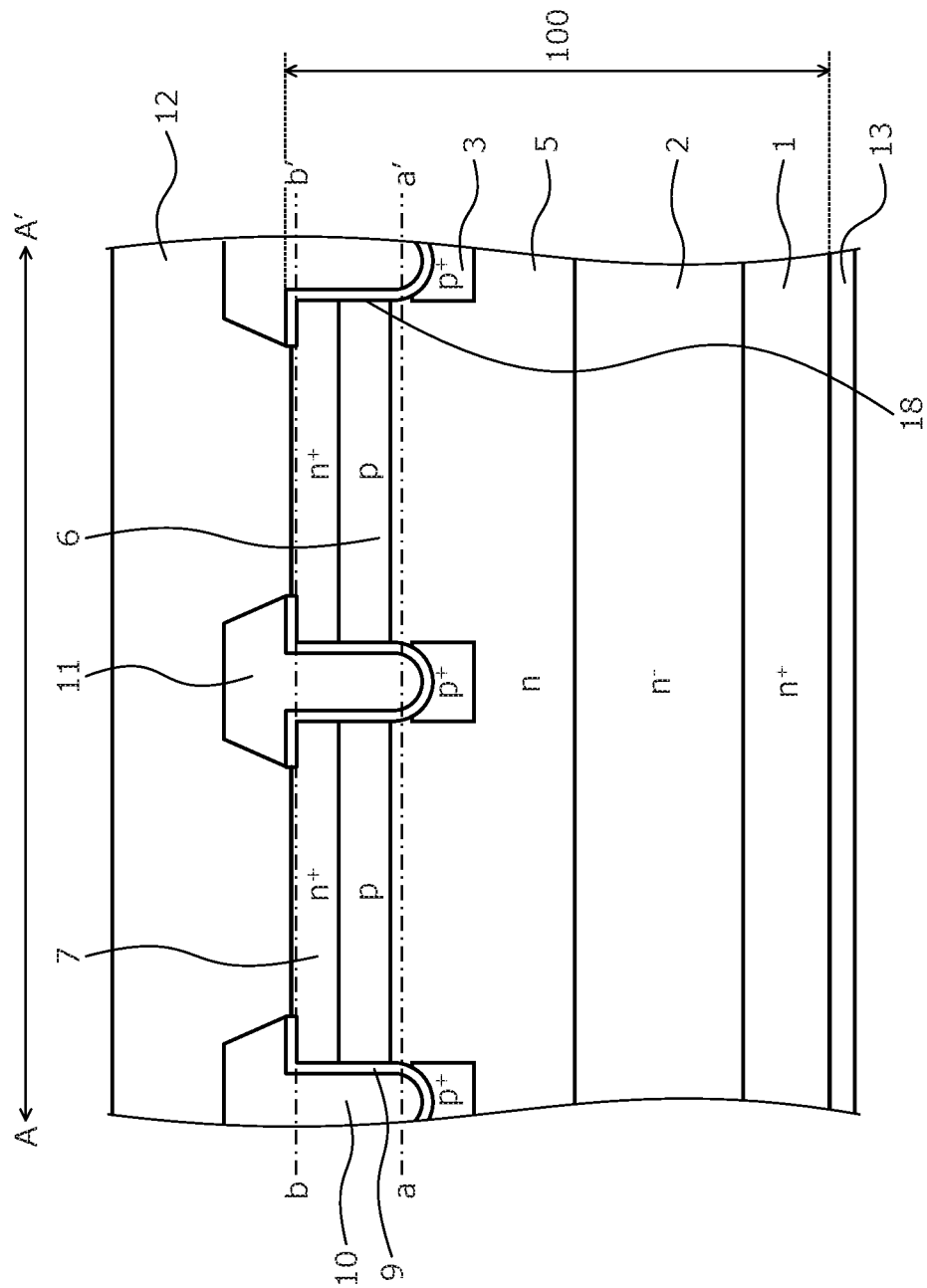
FIG. 15 is a cross-sectional view of a structure of the silicon carbide semiconductor device according to a second embodiment, along cutting line A-A' in FIGS. 6 and 7.
Figure 16:
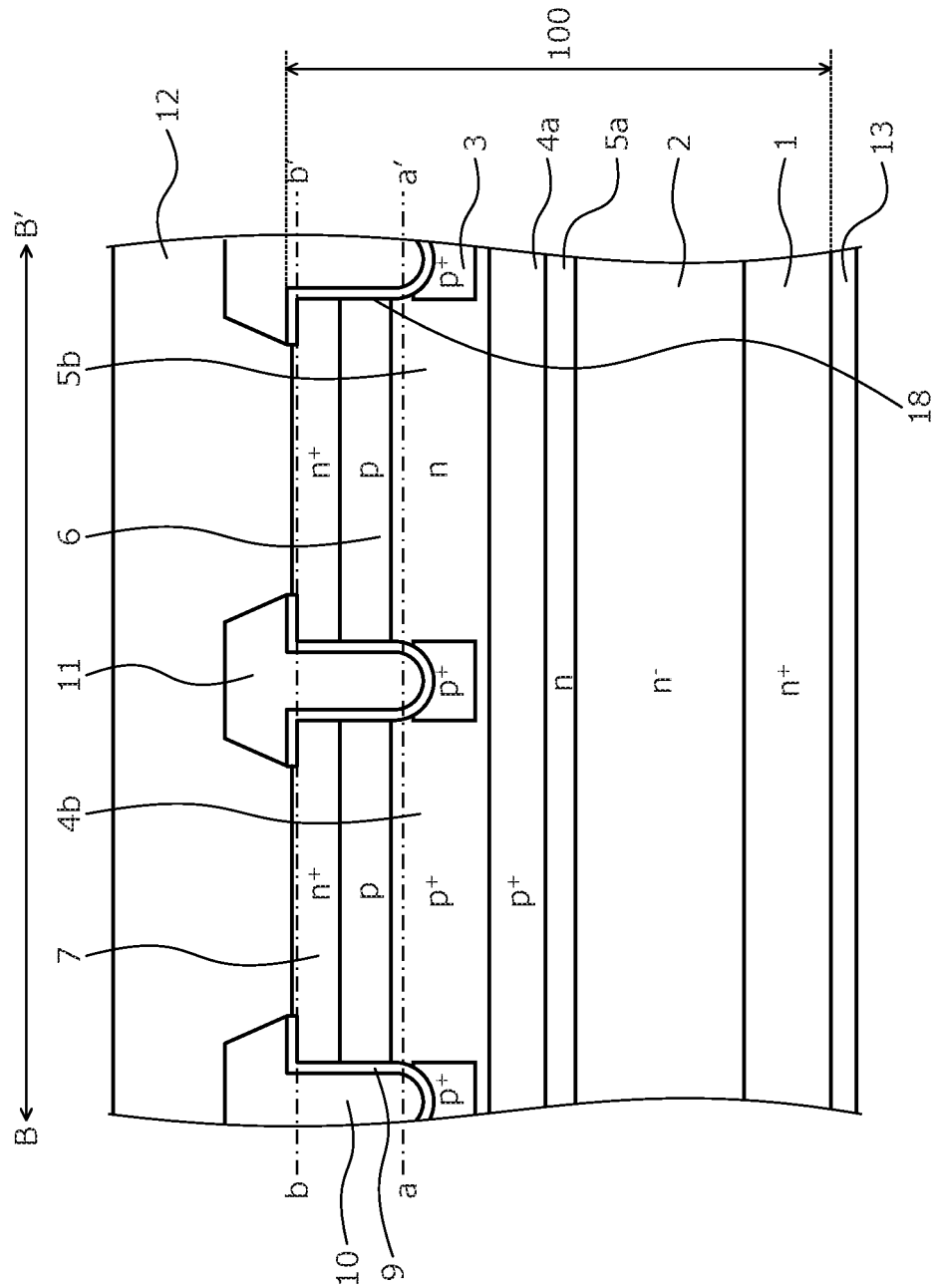
FIG. 16 is a cross-sectional view of the structure of the silicon carbide semiconductor device according to the second embodiment, along cutting line B-B' in FIGS. 6 and 7.
Figure 17:
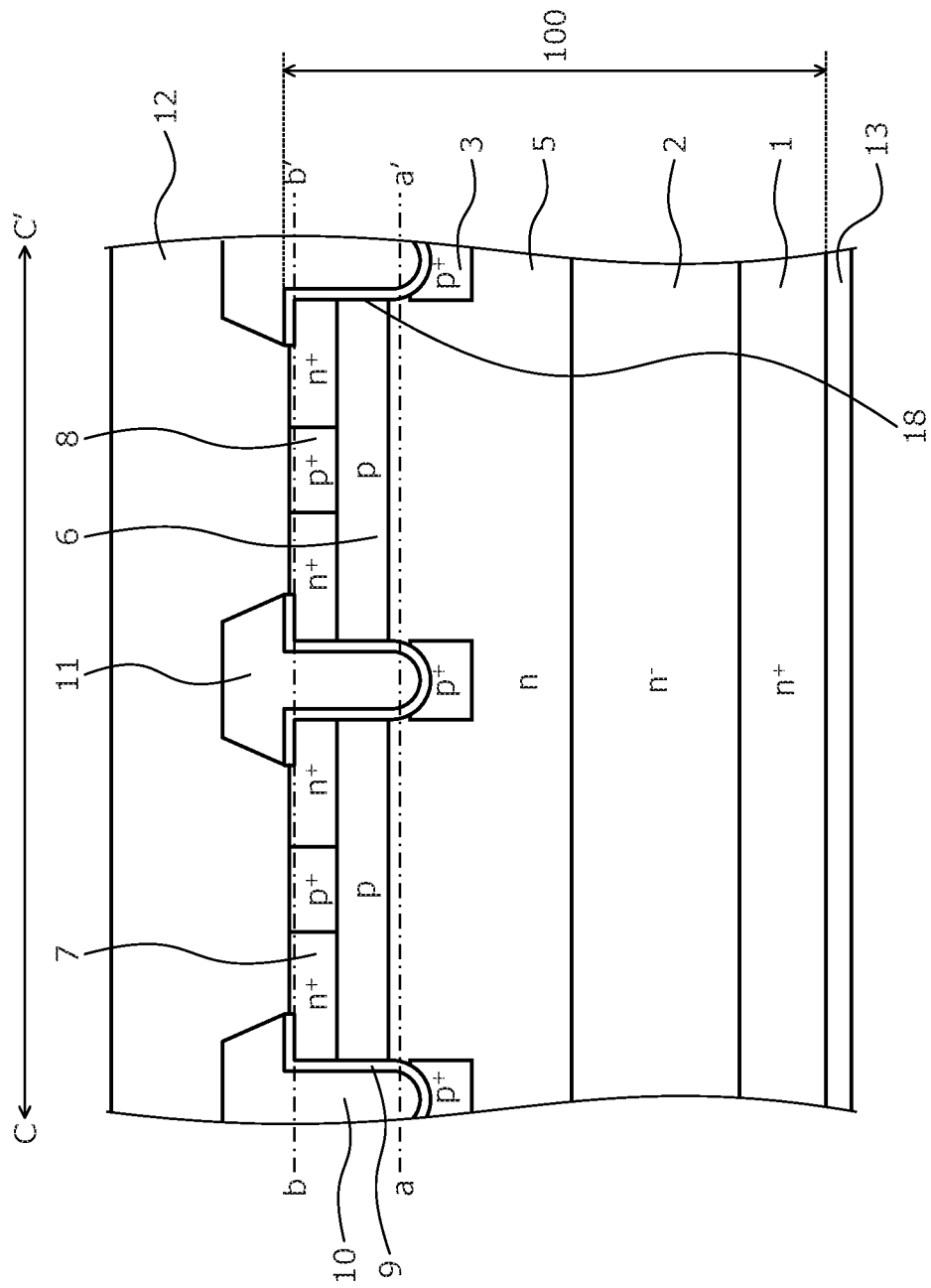
FIG. 17 is a cross-sectional view of the structure of the silicon carbide semiconductor device according to the second embodiment, along cutting line C-C' in FIGS. 6 and 7.
Figure 18:
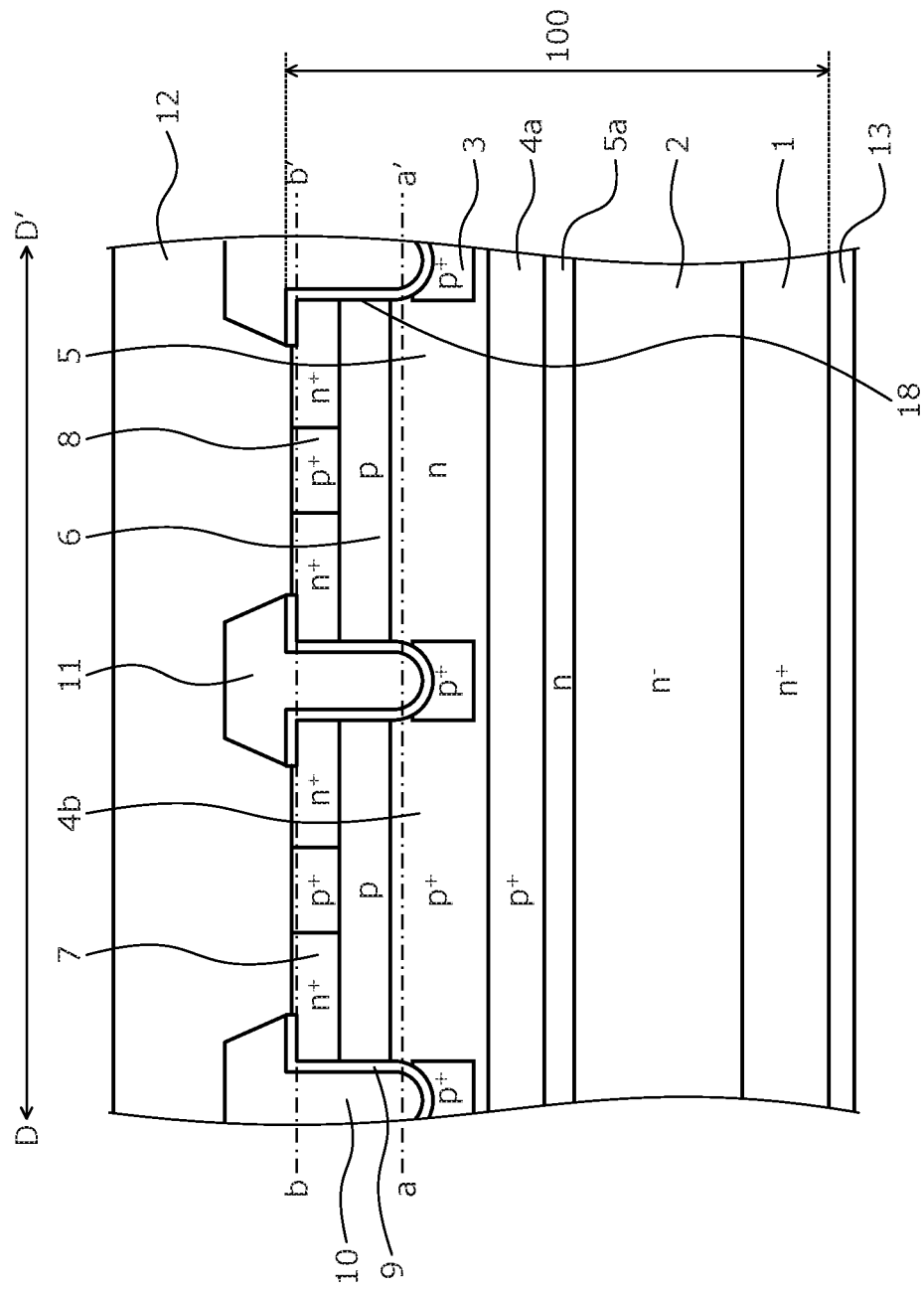
FIG. 18 is a cross-sectional view of the structure of the silicon carbide semiconductor device according to the second embodiment, along cutting line D-D' in FIGS. 6 and 7.

A structure of the silicon carbide semiconductor device according to a second embodiment will be described. FIGS. 15, 16, 17, and 18 are cross-sectional views of the structure of the silicon carbide semiconductor device according to the second embodiment. A top view of the silicon carbide semiconductor device according to the second embodiment is similar to the top view according to the first embodiment (refer to FIGS. 6, 7) is therefore omitted. FIG. 15 is a cross-sectional view along cutting line A-A' in FIGS. 6 and 7, which are top views of the silicon carbide semiconductor device. FIG. 16 is a cross-sectional view along cutting line B-B' in FIGS. 6 and 7; FIG. 17 is a cross-sectional view along cutting line C-C' in FIGS. 6 and 7; and FIG. 18 is a cross-sectional view along cutting line D-D' in FIGS. 6 and 7.

The silicon carbide semiconductor device according to the second embodiment differs from the silicon carbide semiconductor device according to the first embodiment in that, as depicted in FIGS. 16 and 18, the first $p^+$-type region 3 is separated from the lower second $p^+$-type region 4a. As a result, in the second embodiment, the pn junction of the lower second $p^+$-type region 4a and the n-type region 5 is positioned deeper than that in the first embodiment.

Figure 19:
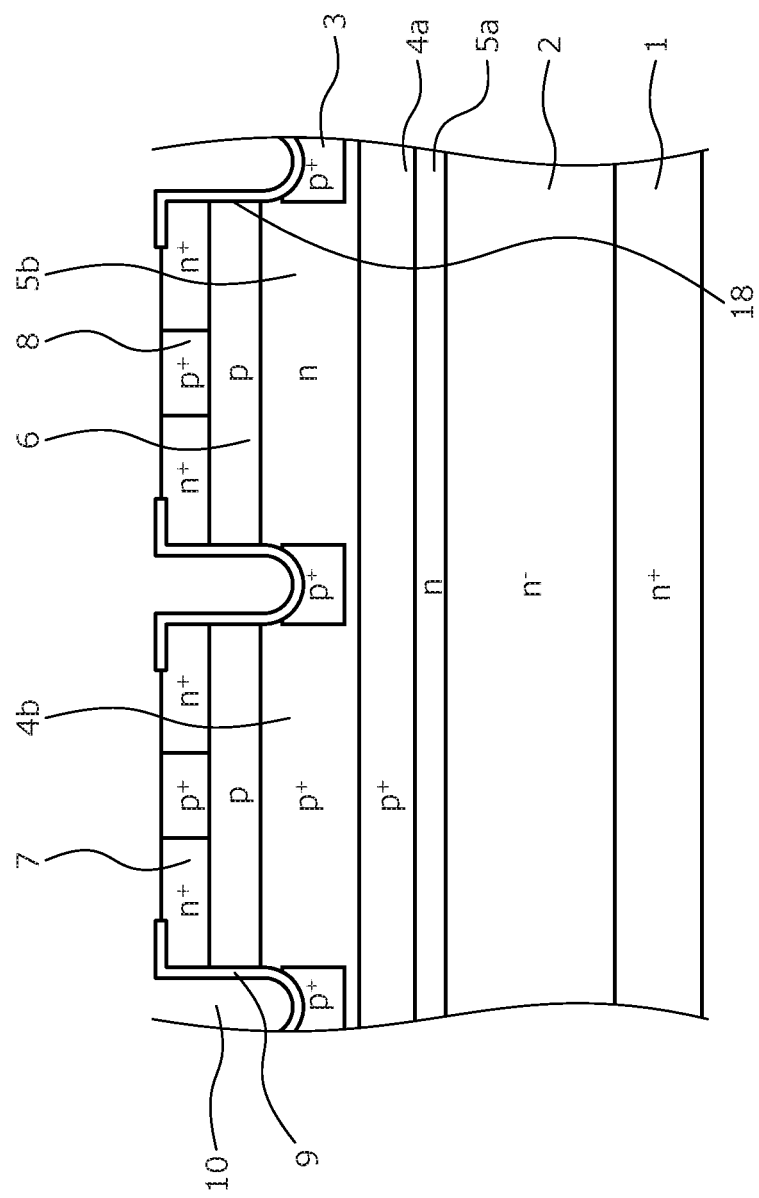
FIG. 19 is a cross-sectional view of the silicon carbide semiconductor device according to the second embodiment during manufacture.

A method of manufacturing the silicon carbide semiconductor device according to the second embodiment will be described. FIG. 19 is a cross-sectional view of the silicon carbide semiconductor device according to the second embodiment during manufacture. First, similarly to the first embodiment, processes of preparing the $n^+$-type silicon carbide substrate 1 to forming the $p^+$-type contact region 8 are sequentially performed (refer to FIGS. 9 to 13).

Next, by photolithography and etching, each trench 18 is formed to penetrate the $n^+$-type source region 7 and the p-type base layer 6, and reach the n-type region 5 and the upper second $p^+$-type region 4b. Next, using the mask used at the time of trench formation, the first $p^+$-type region 3 is selectively formed at the bottom of the trench 18 by ion implantation of a p-type impurity. At this time, the first $p^+$-type region 3 is formed so as to not be in contact with the lower second $p^+$-type region 4a. The state up to here is depicted in FIG. 19. Thereafter, similarly to the first embodiment, the process of forming the gate insulating film 9 and subsequent processes are sequentially performed, whereby the MOSFET depicted in FIGS. 15 to 18 is completed.

As described, according to the second embodiment, effects similar to those of the first embodiment may be obtained. Further, according to the second embodiment, the first $p^+$-type region is provided separated from the lower second $p^+$-type region. As a result, the pn junction of the lower second $p^+$-type region and the n-type region is positioned deeper than that in the first embodiment and thus, further separated from the bottom of the trench. Therefore, application of high electric field at the bottom of the trench may be further suppressed. Shortening of the trench shortens the channel length, enabling the ON resistance of the silicon carbide semiconductor device to be reduced.

Figure 20:
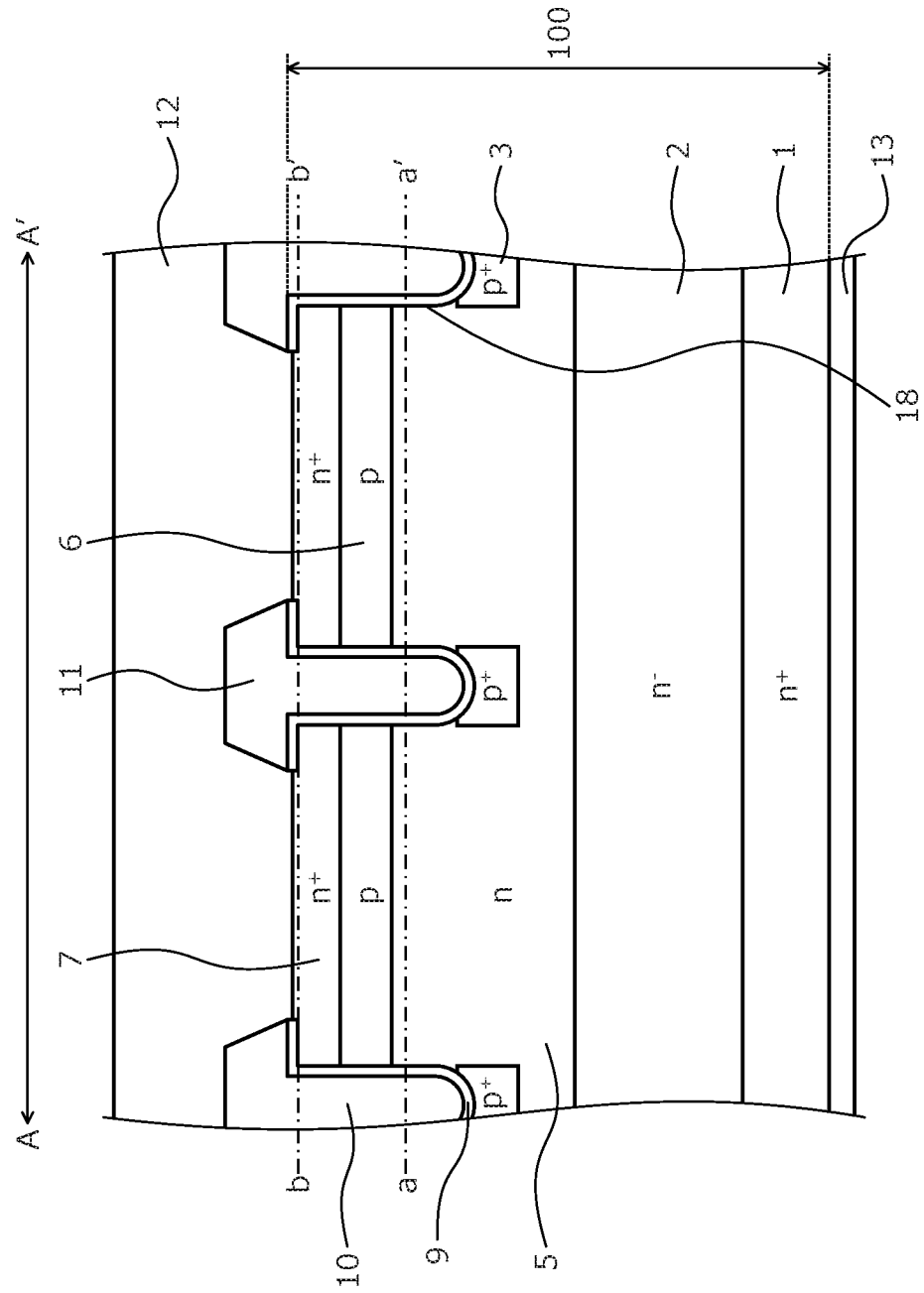
FIG. 20 is a cross-sectional view of a structure of the silicon carbide semiconductor device according to a third embodiment, along cutting line A-A' in FIGS. 6 and 7.
Figure 21:
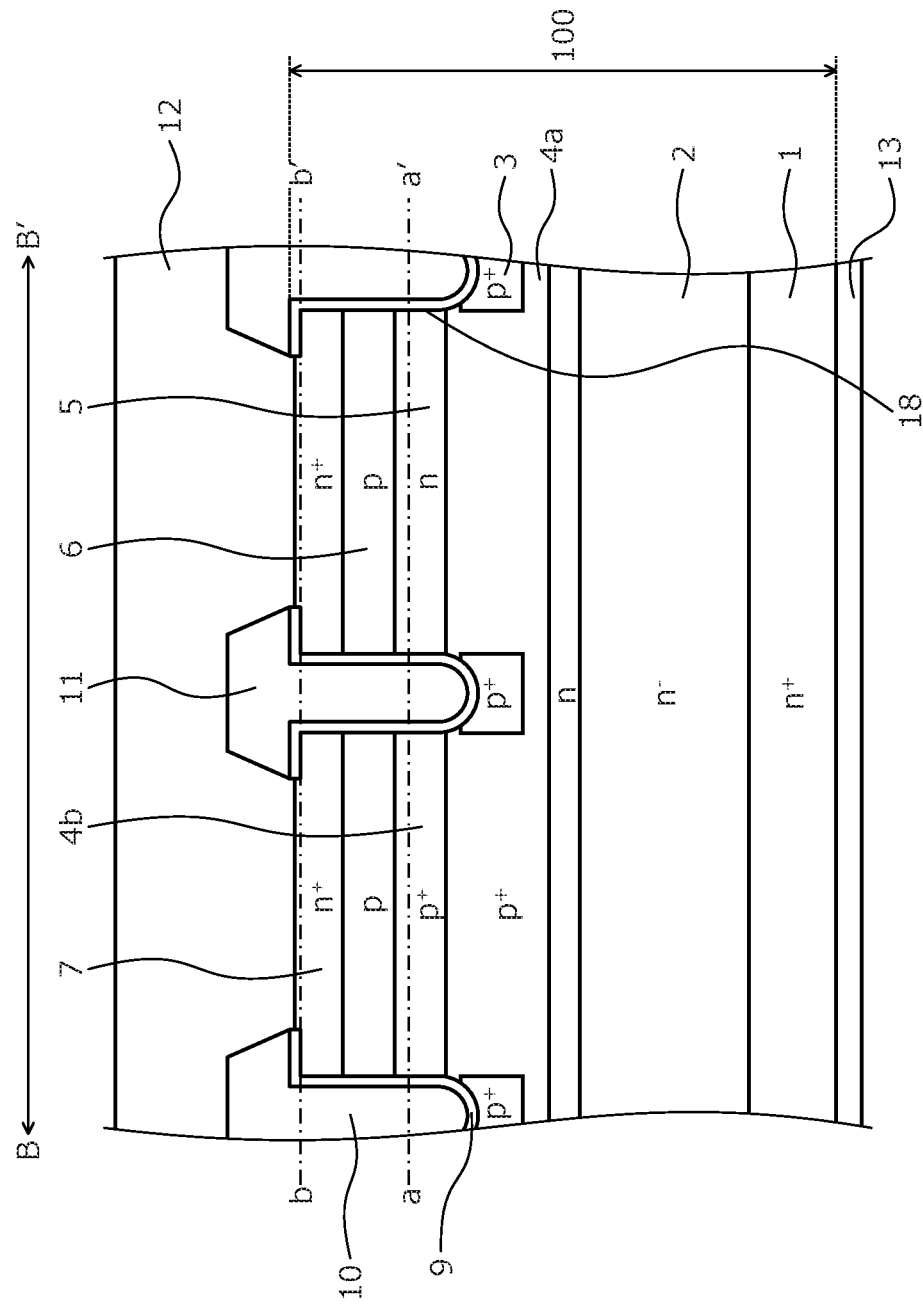
FIG. 21 is a cross-sectional view of the structure of the silicon carbide semiconductor device according to the third embodiment, along cutting line B-B' in FIGS. 6 and 7.
Figure 22:
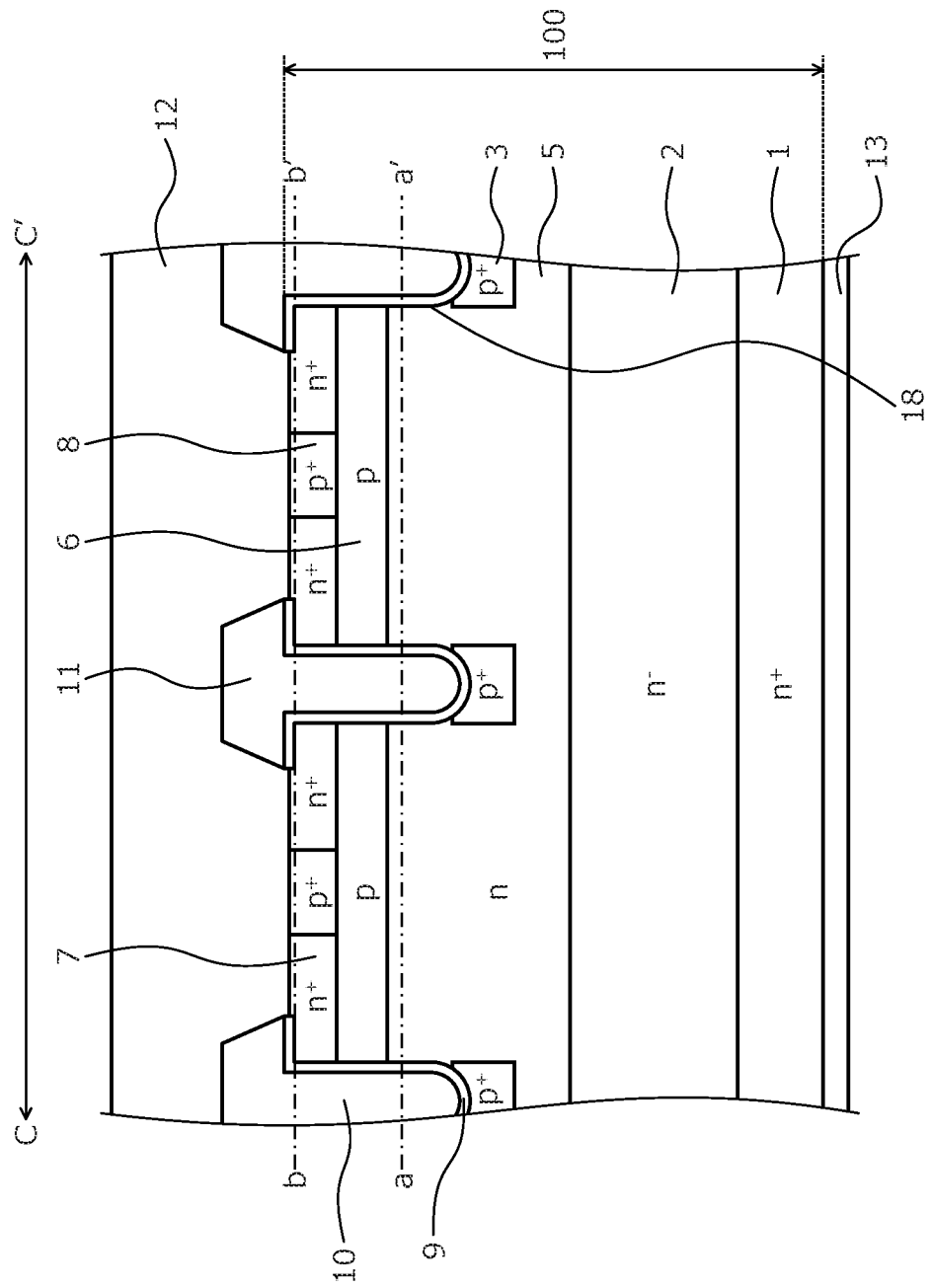
FIG. 22 is a cross-sectional view of the structure of the silicon carbide semiconductor device according to the third embodiment, along cutting line C-C' in FIGS. 6 and 7.
Figure 23:
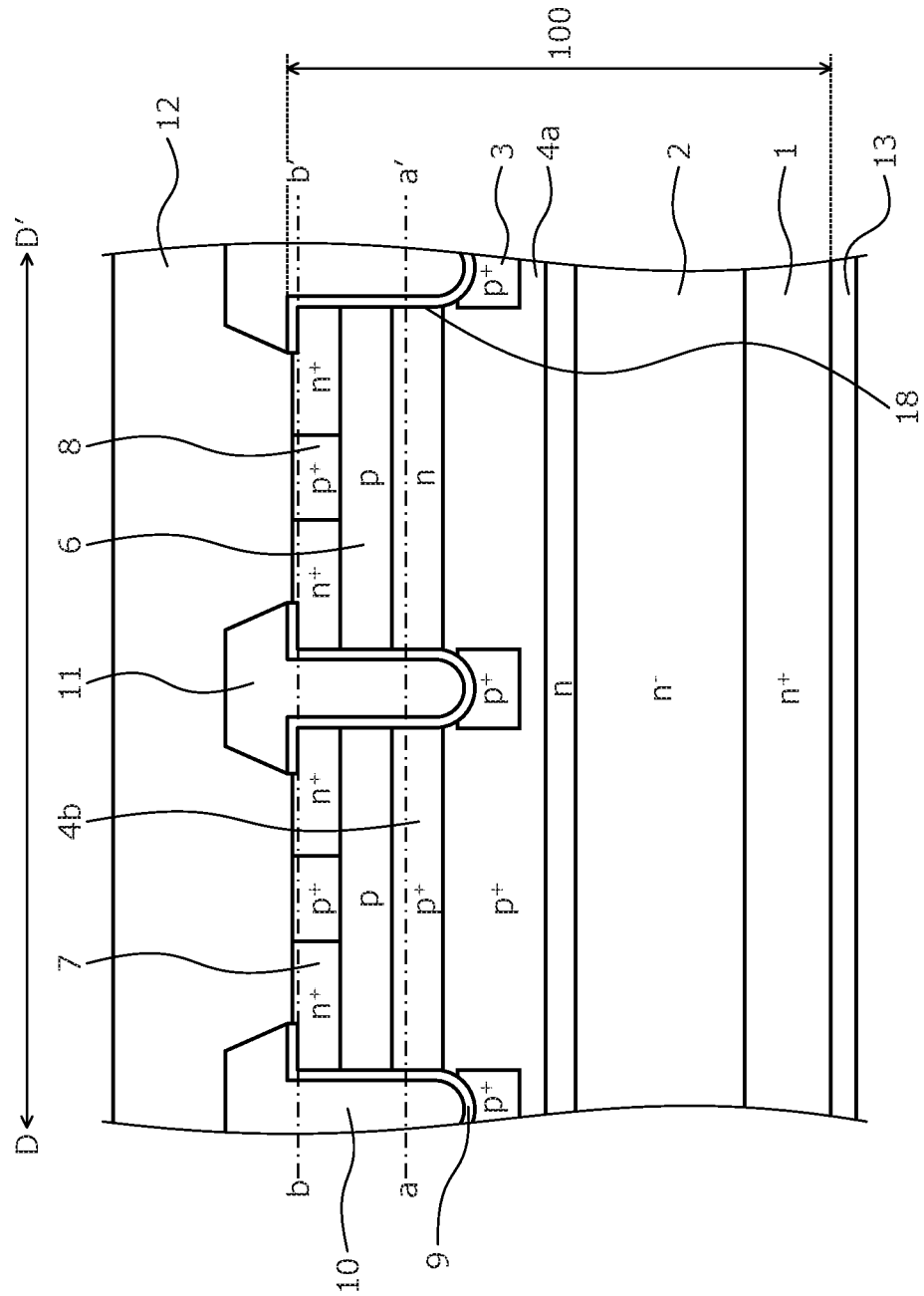
FIG. 23 is a cross-sectional view of the structure of the silicon carbide semiconductor device according to the third embodiment, along cutting line D-D' in FIGS. 6 and 7.

A structure of the silicon carbide semiconductor device according to a third embodiment will be described. FIGS. 20, 21, 22, and 23 are cross-sectional views of the structure of the silicon carbide semiconductor device according to the third embodiment. A top view of the silicon carbide semiconductor device according to the third embodiment is similar to the top view according to the first embodiment (refer to FIGS. 6, 7) is therefore omitted. FIG. 20 is a cross-sectional view along cutting line A-A' in FIGS. 6 and 7, which are top views of the silicon carbide semiconductor device. FIG. 21 is a cross-sectional view along cutting line B-B' in FIGS. 6 and 7; FIG. 22 is a cross-sectional view along cutting line C-C' in FIGS. 6 and 7; and FIG. 23 is a cross-sectional view along cutting line D-D' in FIGS. 6 and 7.

The silicon carbide semiconductor device according to the third embodiment differs from the silicon carbide semiconductor device according to the first embodiment in that, as depicted in FIGS. 20 to 23, the first $p^+$-type region 3 is provided so as to cover the bottom and a bottom corner part of the trench 18, and a width of the first $p^+$-type region 3 is wider than the width of the trench 18. The bottom corner part of the trench 18 is a boundary of the bottom and a side wall of the trench 18.

Figure 24:
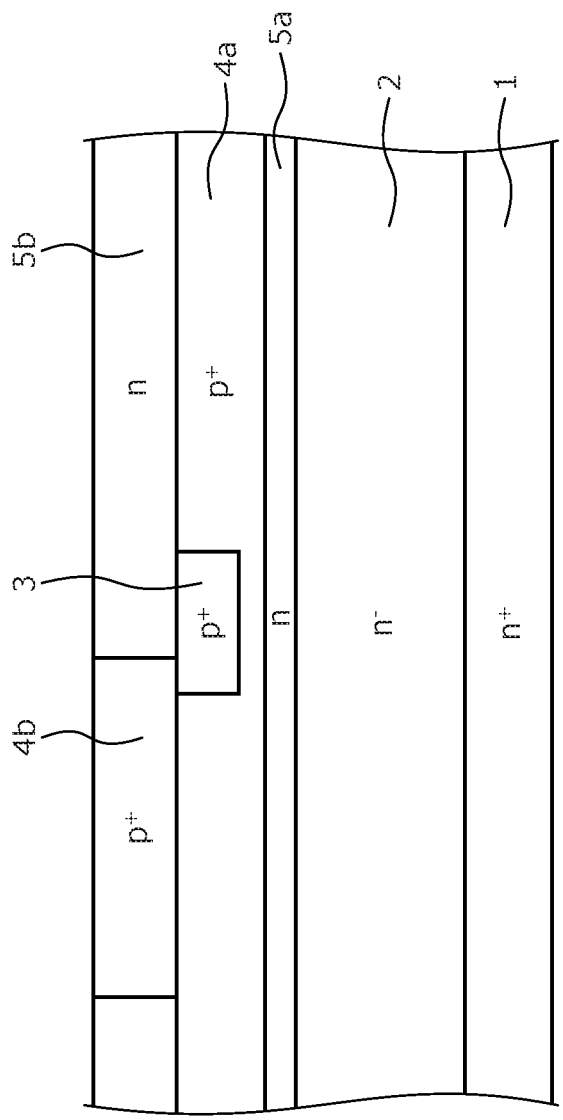
FIG. 24 is a cross-sectional view of the silicon carbide semiconductor device according to the third embodiment during manufacture.

A method of manufacturing the silicon carbide semiconductor device according to the third embodiment will be described. FIG. 24 is a cross-sectional view of the silicon carbide semiconductor device according to the third embodiment during manufacture. First, similarly to the third embodiment, the processes of preparing the $n^+$-type silicon carbide substrate 1 to forming the lower second $p^+$-type region 4a are sequentially performed (refer to FIGS. 9 and 10)

Next, the first $p^+$-type region 3 is selectively formed in a surface layer of the lower second $p^+$-type region 4a by photolithography and ion implantation of a p-type impurity. For example, a dose amount at the time of the ion implantation for forming the first $p^+$-type region 3 may be so that an impurity concentration thereof becomes about $5\times10^{18}/cm^3$.

Thereafter, similarly to the first embodiment, the processes from forming the upper n-type region 5b to forming the $n^+$-type source region 7 are sequentially performed. Next, by photolithography and etching, each trench 18 is formed to penetrate the $n^+$-type source region 7 and the p-type base layer 6, and reach the n-type region 5 and the lower second $p^+$-type region 4a. Thereafter, similarly to the first embodiment, the process of forming the gate insulating film 9 and subsequent processes are sequentially performed, whereby the MOSFET depicted in FIGS. 20 to 23 is completed.

As described, according to the third embodiment, effects similar to those of the first embodiment may be obtained. Further, in the third embodiment, the first $p^+$-type base region having a width that is wider than that of the trench is provided, whereby the electric field at the bottom of the trench may mitigate the electric field that concentrates at the corner part. Therefore, the breakdown voltage of the silicon carbide semiconductor device may further increased.

Figure 25:
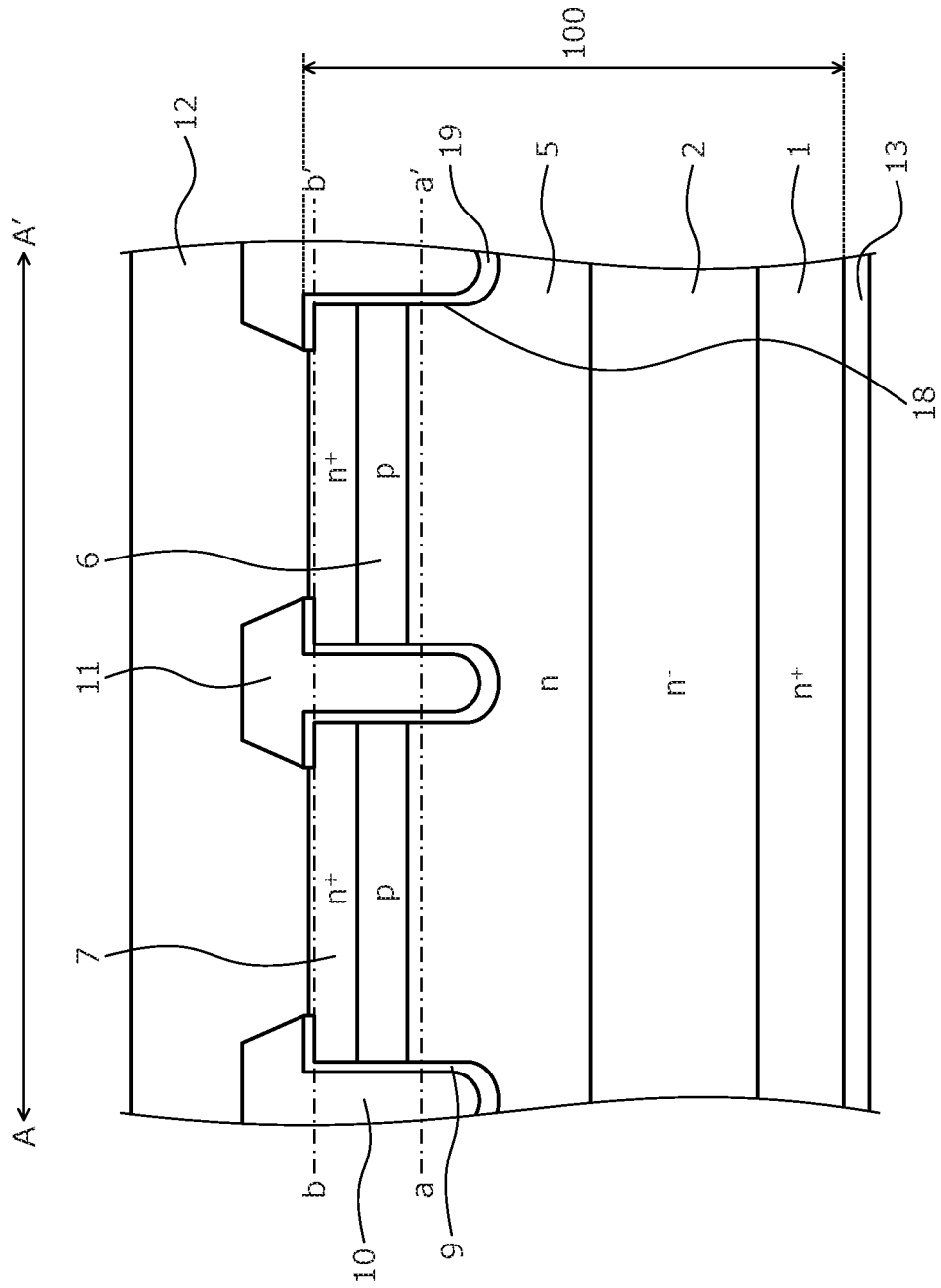
FIG. 25 is a cross-sectional view of a structure of the silicon carbide semiconductor device according to a fourth embodiment, along cutting line A-A' in FIGS. 6 and 7.
Figure 26:
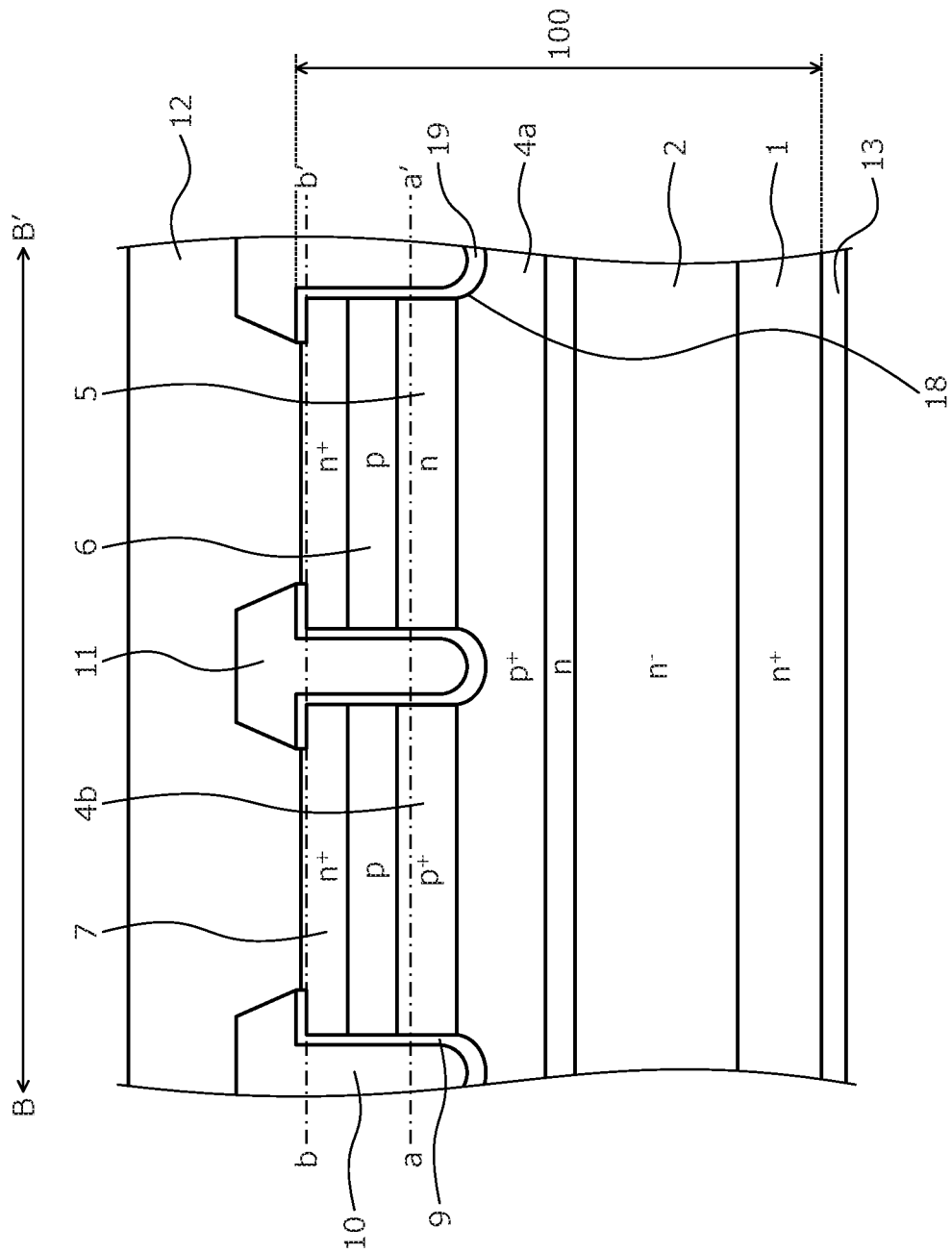
FIG. 26 is a cross-sectional view of the structure of the silicon carbide semiconductor device according to the fourth embodiment, along cutting line B-B' in FIGS. 6 and 7.
Figure 27:
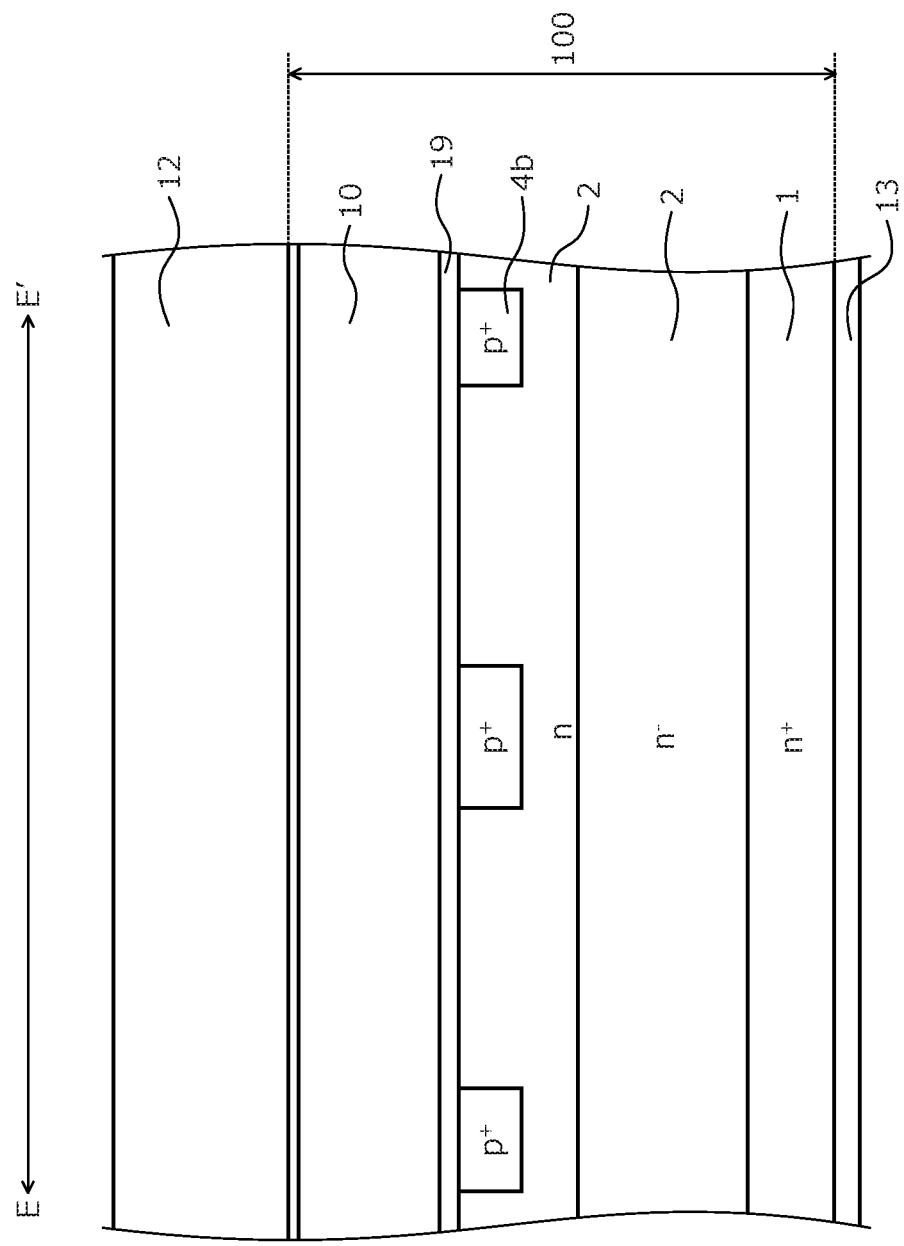
FIG. 27 is a cross-sectional view of the structure of the silicon carbide semiconductor device according to the fourth embodiment, along cutting line E-E' in FIGS. 6 and 7.

A structure of the silicon carbide semiconductor device according to a fourth embodiment will be described. FIGS. 25, 26, and 27 are cross-sectional views of the structure of the silicon carbide semiconductor device according to the fourth embodiment. FIG. 27 is a cross-sectional view along cutting line E-E' in FIGS. 6 and 7 each depicting the structure of the silicon carbide semiconductor device according to the fourth embodiment. FIG. 25 is a cross-sectional view along cutting line A-A' in FIGS. 6 and 7, which are top views of the silicon carbide semiconductor device. FIG. 26 is a cross-sectional view along cutting line B-B' in FIGS. 6 and 7.

The silicon carbide semiconductor device according to the fourth embodiment differs from the silicon carbide semiconductor device according to the first embodiment in that, as depicted in FIGS. 25 to 27, the first $p^+$-type region 3 is not provided and a thickness of an oxide film 19 at the bottom of the trench 18 is thicker with respect to a thickness of an oxide film (gate insulating film 9) at a side wall of the trench 18.

A method of manufacturing the silicon carbide semiconductor device according to the fourth embodiment will be described. After formation of the trench 18, the oxide film 19 is deposited at the trench bottom and etching back is performed. Thereafter, a gate oxide film is formed, whereby the oxide film 19 at the trench bottom may be formed to be thicker with respect to the oxide film at the trench side wall.

As described, according to the fourth embodiment, effects similar to those of the first embodiment may be obtained. Further, in the fourth embodiment, the oxide film at the trench bottom is made thick, enabling electric field at the trench bottom to be mitigated. Therefore, the breakdown voltage of the silicon carbide semiconductor device may be further increased.

Figure 28:
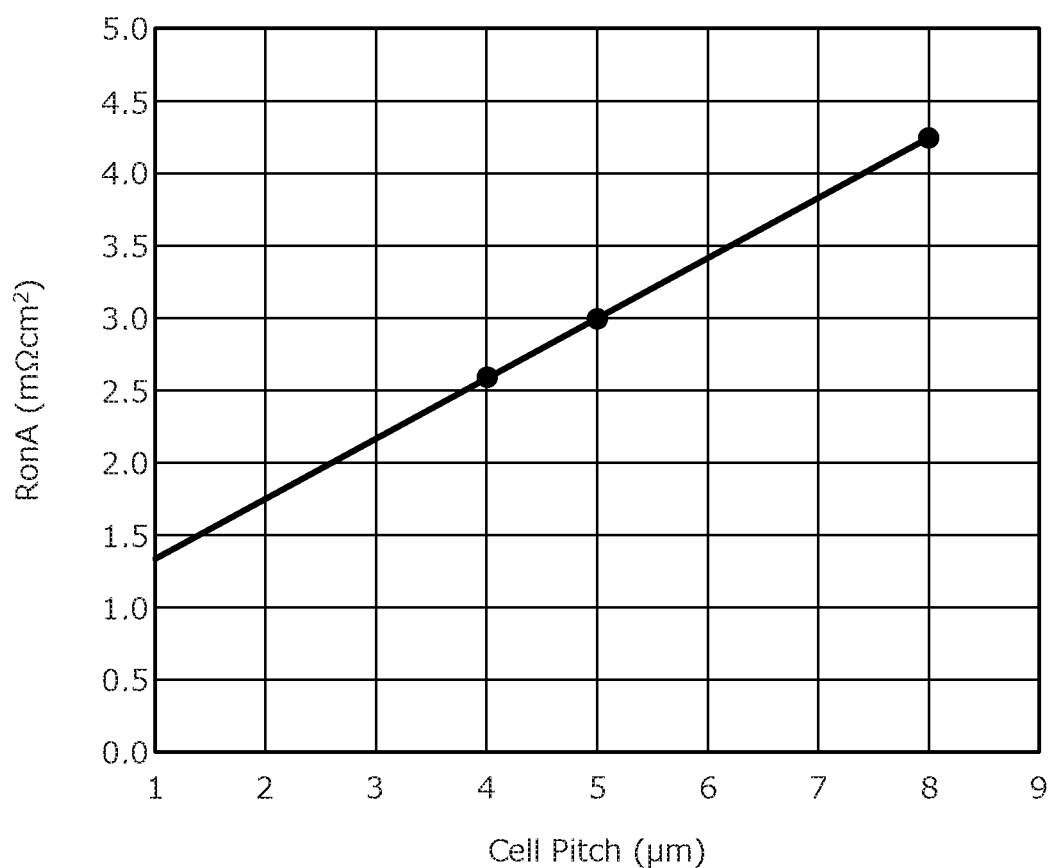
FIG. 28 is a graph depicting a relationship of cell pitch and ON resistance of the silicon carbide semiconductor device according to the first to the fourth embodiments.
Figure 29:
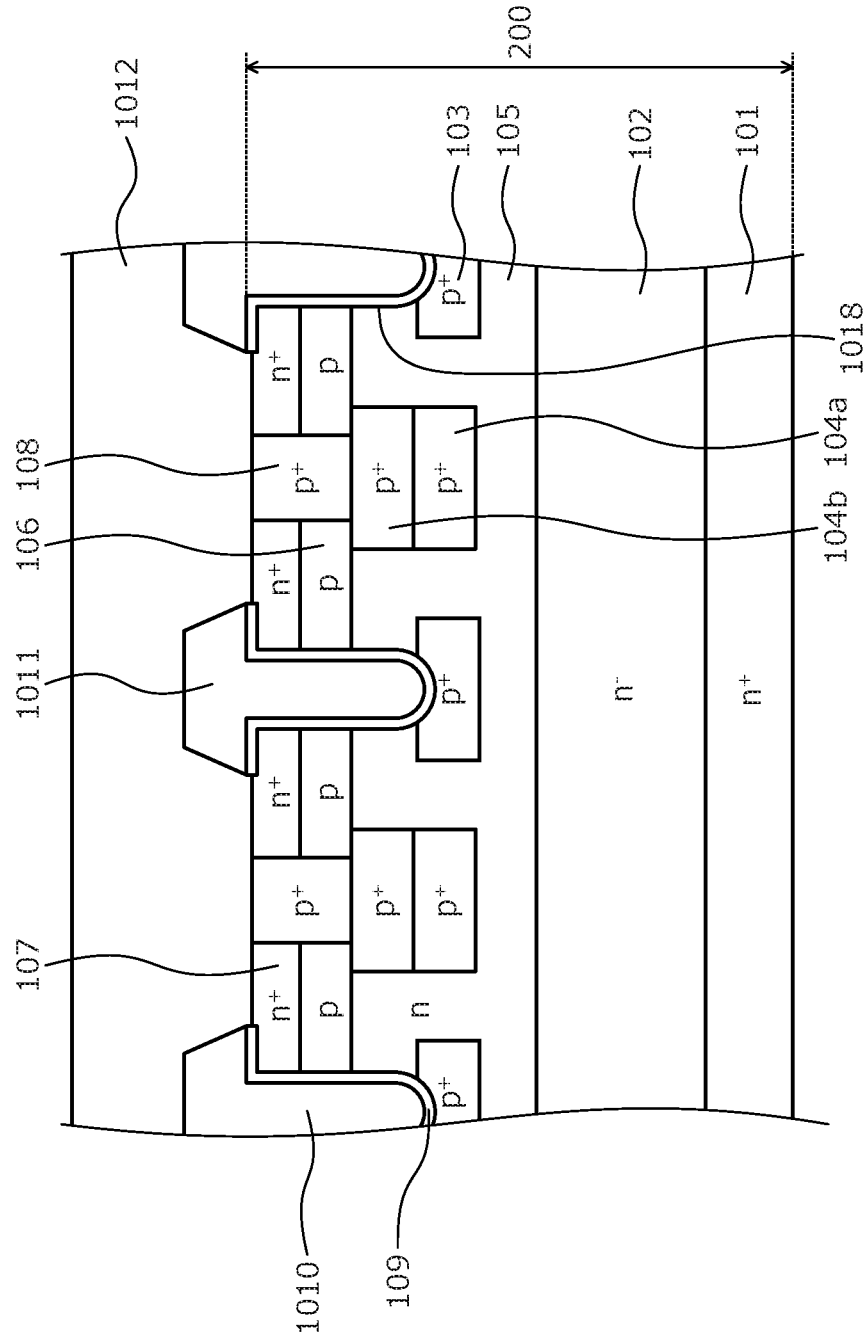
FIG. 29 is a cross-sectional view of a structure of a conventional silicon carbide semiconductor device.
Figure 30:
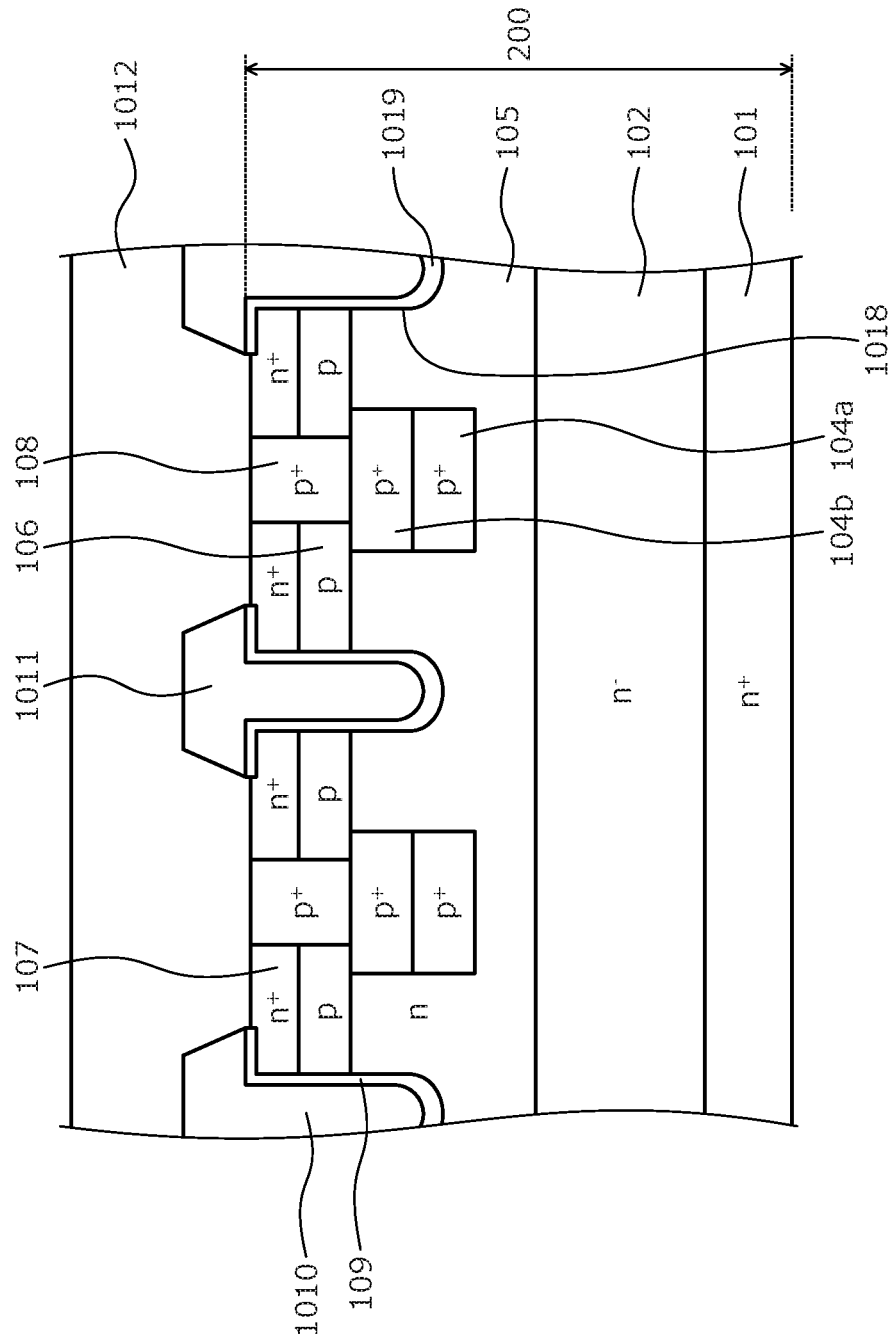
FIG. 30 is a cross-sectional view of another structure of a conventional silicon carbide semiconductor device.

FIG. 28 is a graph depicting a relationship of cell pitch and ON resistance of the silicon carbide semiconductor device according to the first to the fourth embodiments. FIG. 28 depicts results of simulation where a thickness of the $n^+$-type silicon carbide substrate 1 is assumed to be 150 μm, a drain current density Jc is assumed to be 300 A/cm², and forward voltage Vth is assumed to be 5V. A horizontal axis represents the cell pitch of the silicon carbide semiconductor device in units of μm, while a vertical axis represents ON resistance (RonA) per unit active area in units of mΩcm². According to FIG. 28, for cell pitches of 4 μm or greater, which may be realized by a conventional technique and for cell pitches less than 4 μm, which may be realized by the present invention, the ON resistance decreases as the cell pitch decreases. The present invention enables a silicon carbide semiconductor device having a cell pitch of less than 4 μm to be provided and thus, may provide a silicon carbide semiconductor device having a lower ON resistance.

In the embodiments of the present invention, various modifications within a range not deviating from the spirit of the invention are possible. For example, in the embodiments, dimensions, impurity concentrations, etc. of regions may be variously changed according to required specifications. Further, while a MOSFET has been described as an example in the embodiments, without limitation hereto, wide application to various types of silicon carbide semiconductor devices that conduct and interrupt current by gate driving control based on a predetermined gate threshold voltage is possible. For example, an insulated gate bipolar transistor (IGBT), etc. may be given as a silicon carbide semiconductor device under gate driving control. In the embodiments, while description has been given taking, as an example, a case where silicon carbide is used as a wide bandgap semiconductor material, application to another wide bandgap semiconductor material other than silicon carbide such as, for example, gallium nitride (GaN) is possible. Further, in the embodiments, while a first conductivity type is assumed to be an n-type and a second conductivity type is assumed to be a p-type, the invention is similarly implemented when the first conductivity type is a p-type and the second conductivity type is an n-type.

According to the embodiments of the present invention, the lower second $p^+$-type region 4a is disposed orthogonally to the width direction of the trench, whereby after formation of the upper second $p^+$-type region 4b, the trench may be formed. As a result, deviations on the alignment of the upper second $p^+$-type region 4b and the trench with the lower second $p^+$-type region 4a may be suppressed. Further, the upper second $p^+$-type region 4b is disposed so as to be at the trench side wall, thereby facilitating connection of the lower second p$^+$-type region 4a to the source electrode by using photolithography of a same precision as that used conventionally, even when the cell pitch is decreased to be less than 4.0 μm. Moreover, the first p$^+$-type region 3 formed by self-alignment with the trench or the oxide film at the bottom of the trench is made thicker, whereby application of high electric field at the bottom of the trench may be suppressed and thus, intervals of the trench not in contact with the lower second p$^+$-type region 4a enable provision of the silicon carbide semiconductor device that realizes a target breakdown voltage. Herein, the cell pitch is a distance between centers of adjacent trenches.

According to the embodiments of the present invention, the total mathematical area of the regions between the p-type base layer 6 and the lower second p$^+$-type region 4a and in which the upper second p$^+$-type region 4b is not provided is made at least two times larger than the total mathematical area of the regions between the p-type base layer 6 and the lower second p$^+$-type region 4a and in which the upper second p$^+$-type region 4b is provided. The regions between the p-type base layer 6 and the lower second p$^+$-type region 4a and in which the upper second p$^+$-type region 4b is not provided are regions through which current flows in the ON state and therefore, the regions through which current flows in the ON state may be sufficiently established and degradation of the performance of the silicon carbide semiconductor device may be prevented.

The silicon carbide semiconductor device and method of manufacturing a silicon carbide semiconductor device according to the embodiments of the present invention achieve an effect in that even when the cell pitch is reduced to less than 4.0 μm, a silicon carbide semiconductor device that realizes a target breakdown voltage may be manufactured by a method of the same degree of manufacturing difficulty as that of a conventional method.

As described, the silicon carbide semiconductor device and the method of manufacturing a silicon carbide semiconductor device according to the embodiments of the present invention are useful for power semiconductor devices used in power converting equipment and power supply devices such as in industrial machines, and are particularly suitable for silicon carbide semiconductor devices having a trench gate structure.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
   a silicon carbide substrate of a first conductivity type;
   a first semiconductor layer of the first conductivity type provided on a front surface of the silicon carbide substrate;
   a second semiconductor layer of the first conductivity type provided on a surface of the first semiconductor layer and having an impurity concentration that is higher than that of the first semiconductor layer;
   a third semiconductor layer of a second conductivity type provided on a surface of the second semiconductor layer;
   a fourth semiconductor layer of the first conductivity type selectively provided at a surface of the third semiconductor layer;
   a fifth semiconductor layer of the second conductivity type selectively provided at the surface of the third semiconductor layer;
   a trench penetrating the fourth semiconductor layer and the third semiconductor layer, and reaching the second semiconductor layer;
   a gate insulating film provided in the trench;
   a gate electrode provided in the trench on the gate insulating film;
   a first electrode in contact with the fourth semiconductor layer and the fifth semiconductor layer;
   a second electrode provided at a rear surface of the silicon carbide substrate;
   a sixth semiconductor layer of the second conductivity type selectively disposed in the second semiconductor layer so as to be in contact with a side wall of the trench and the third semiconductor layer;
   a seventh semiconductor layer of the second conductivity type provided so as to be in contact with the sixth semiconductor layer and a part of the trench, the seventh semiconductor layer crossing the trench in a direction orthogonal to the trench; and
   an eighth semiconductor layer of the second conductivity type that is in contact with a part of the seventh semiconductor layer and an entire bottom of the trench, that is positioned farther from the second electrode than is the seventh semiconductor layer.

2. The silicon carbide semiconductor device according to claim 1, wherein the sixth semiconductor layer is selectively disposed in a plane above the seventh semiconductor layer, along a line parallel to the side wall of the trench.

3. The silicon carbide semiconductor device according to claim 1, wherein the sixth semiconductor layer is selectively disposed in a plane above the seventh semiconductor layer, so as to be in a diamond-shape with respect to the side wall of the trench.

4. The silicon carbide semiconductor device according to claim 1, wherein the sixth semiconductor layer is selectively disposed in a plane above the seventh semiconductor layer, so as to be diagonal with respect to the side wall of the trench.

5. The silicon carbide semiconductor device according to claim 2, wherein the sixth semiconductor layer is repeatedly disposed at an interval of at least 10 μm along a direction orthogonal to the trench.

6. The silicon carbide semiconductor device according to claim 4, wherein the sixth semiconductor layer is repeatedly disposed at an interval of at least 10 μm along a direction orthogonal to the trench.

7. A silicon carbide semiconductor device, comprising:
   a silicon carbide substrate of a first conductivity type;
   a first semiconductor layer of the first conductivity type provided on a front surface of the silicon carbide substrate;
   a second semiconductor layer of the first conductivity type provided on a surface of the first semiconductor layer and having an impurity concentration that is higher than that of the first semiconductor layer;
   a third semiconductor layer of a second conductivity type provided on a surface of the second semiconductor layer;
   a fourth semiconductor layer of the first conductivity type selectively provided at a surface of the third semiconductor layer;
   a fifth semiconductor layer of the second conductivity type selectively provided at the surface of the third semiconductor layer;

a trench penetrating the fourth semiconductor layer and the third semiconductor layer, and reaching the second semiconductor layer;

a first insulating film in contact with a side wall of the trench and the third semiconductor layer;

a gate electrode provided in the trench on the first insulating film;

a first electrode in contact with the fifth semiconductor layer and the fourth semiconductor layer;

a second electrode provided at a rear surface of the silicon carbide substrate;

a sixth semiconductor layer of the second conductivity type selectively disposed in the second semiconductor layer in contact with the side wall of the trench and the third semiconductor layer;

a seventh semiconductor layer of the second conductivity type provided in contact with the sixth semiconductor layer and a part of the trench, the seventh semiconductor layer crossing the trench in a direction orthogonal to the trench; and a second insulating film in contact with at least a part of a bottom of the trench and having a thickness that is at least 1.1 times thicker than that of the first insulating film, wherein the sixth semiconductor layer is selectively disposed in a plane above the seventh semiconductor layer so as to be diagonal with respect to the side wall of the trench.

8. The silicon carbide semiconductor device according to claim 7, wherein the sixth semiconductor layer is selectively disposed in a plane above the seventh semiconductor layer, along a line parallel to the side wall of the trench.

9. The silicon carbide semiconductor device according to claim 7, wherein the sixth semiconductor layer is selectively disposed in a plane above the seventh semiconductor layer so as to be in a diamond-shape with respect to the side wall of the trench.

10. The silicon carbide semiconductor device according to claim 8, wherein the sixth semiconductor layer is repeatedly disposed at an interval of at least 10 μm along a direction orthogonal to the trench.

11. The silicon carbide semiconductor device according to claim 7, wherein the sixth semiconductor layer is repeatedly disposed at an interval of at least 10 μm along a direction orthogonal to the trench.

* * * * *